(12) United States Patent
Noda et al.

(10) Patent No.: US 10,532,374 B2
(45) Date of Patent: Jan. 14, 2020

(54) THIN FILM PRODUCTION METHOD AND ORGANIC EL DEVICE PRODUCTION METHOD

(71) Applicant: SUMITOMO CHEMICAL COMPANY, LIMITED, Tokyo (JP)

(72) Inventors: Motoo Noda, Niihama (JP); Hidekazu Shiomi, Fukui (JP); Akihide Suzuki, Fukui (JP)

(73) Assignee: SUMITOMO CHEMICAL CO., LTD., Chuo-ku, Tokyo (JP)

( * ) Notice: Subject to any disclaimer, the term of this patent is extended or adjusted under 35 U.S.C. 154(b) by 0 days.

(21) Appl. No.: 15/764,575

(22) PCT Filed: Sep. 6, 2016

(86) PCT No.: PCT/JP2016/076183
§ 371 (c)(1),
(2) Date: Mar. 29, 2018

(87) PCT Pub. No.: WO2017/056875
PCT Pub. Date: Apr. 6, 2017

(65) Prior Publication Data
US 2019/0054494 A1 Feb. 21, 2019

(30) Foreign Application Priority Data
Sep. 30, 2015 (JP) .................. 2015-194859

(51) Int. Cl.
*H01L 51/00* (2006.01)
*H01L 51/56* (2006.01)
(Continued)

(52) U.S. Cl.
CPC .......... *B05C 5/027* (2013.01); *H01L 51/0005* (2013.01); *H01L 51/0097* (2013.01);
(Continued)

(58) Field of Classification Search
None
See application file for complete search history.

(56) References Cited

U.S. PATENT DOCUMENTS 7,745,991 B2 * 6/2010 Yamazaki ........... H01L 27/3244
313/506
2003/0007033 A1 1/2003 Ito et al.
(Continued)

FOREIGN PATENT DOCUMENTS

EP 1914078 A2 4/2008
JP 2005-095834 A 4/2005
(Continued)

OTHER PUBLICATIONS

International Preliminary Report on Patentability dated Apr. 12, 2018, in counterpart International Application No. PCT/JP2016/076183.
(Continued)

*Primary Examiner* — Bo B Jang
(74) *Attorney, Agent, or Firm* — Sughrue Mion, PLLC

(57) ABSTRACT

A thin film production method according to one embodiment includes: a coating film forming step of forming a coating film by discharging a coating liquid on a support from first to M-th line heads (M is 2 or larger and N or smaller) while allowing the support to pass through N line heads once; and a drying step of obtaining a thin film by drying the coating film. A thin film forming nozzle hole 28 of the m-th line head (m is 2 or larger and M or smaller) is arranged to be positioned between adjacent thin film forming nozzle holes in an (m−1)-th thin film forming nozzle hole array $Q_{m-1}$. Every time the first line head discharges the coating liquid, the m-th line head applies the coating liquid onto the support at a predetermined delay time with respect to a discharge time of the first line head. The first to M-th line heads discharge the coating liquid from the film forming nozzle (Continued)

hole selected in accordance with a shape of a thin film formation region onto the support.

12 Claims, 13 Drawing Sheets

(51) Int. Cl.
 *H01L 51/50* (2006.01)
 *B05C 5/02* (2006.01)
(52) U.S. Cl.
 CPC .......... *H01L 51/56* (2013.01); *H01L 51/5012* (2013.01); *H01L 2251/5338* (2013.01); *H01L 2251/556* (2013.01); *H01L 2251/558* (2013.01)

(56) References Cited

U.S. PATENT DOCUMENTS

2005/0212834 A1 9/2005 Akahira et al.
2006/0214957 A1 9/2006 Wada

FOREIGN PATENT DOCUMENTS

| | | |
|---|---|---|
| JP | 2005-306012 A | 11/2005 |
| JP | 2006-264152 A | 10/2006 |
| JP | 2010-205626 A | 9/2010 |
| JP | 2011-131116 A | 7/2011 |
| JP | 2012-238479 A | 12/2012 |
| WO | 2008/153134 A1 | 12/2008 |
| WO | 2010/055751 A1 | 5/2010 |

OTHER PUBLICATIONS

International Search Report dated Nov. 29, 2016, in counterpart International Application No. PCT/JP2016/076183.
Communication dated Apr. 30, 2019, from the State Intellectual Property Office of People's Republic of China in counterpart Application No. 201680057159.4.
Extended European Search Report dated Apr. 17, 2019 for EP Application No. 16851051.9.

* cited by examiner

THIN FILM PRODUCTION METHOD AND ORGANIC EL DEVICE PRODUCTION METHOD

CROSS REFERENCE TO RELATED APPLICATIONS

This application is a National Stage of International Application No. PCT/JP2016/076183, filed Sep. 6, 2016, claiming priority based on Japanese Patent Application No. 2015-194859, filed Sep. 30, 2015, the disclosures of which are incorporated herein by reference.

TECHNICAL FIELD

The present invention relates to a thin film production method and an organic EL device production method.

BACKGROUND ART

As a technique of producing a thin film on a support, there is a method of using a slit coater as disclosed in Patent Literature 1. In the method using the slit coater, a coating liquid containing a thin film forming material is applied onto a support from a slit of the slit coater with a predetermined thickness to form a coating film. Thereafter, the coating film is dried to produce a thin film.

CITATION LIST

Patent Literature

Patent Literature 1: Japanese Unexamined Patent Publication No. 2011-131116

SUMMARY OF INVENTION

Technical Problem

In the case of producing the thin film using the slit coater, a pattern of the thin film depends on a shape of the slit. Therefore, it is necessary to replace the shape of the slit with a different desired one, for example, when it is attempted to produce a thin film of a different pattern. Thus, operation efficiency of an apparatus is lowered, and as a result, production efficiency of the thin film is lowered.

Therefore, the present invention aims to provide a thin film production method and an organic EL device production method that can achieve improvement of production efficiency.

Solution to Problem

A thin film production method according to one embodiment of the present invention is a thin film production method for forming a thin film on a support by using an ink jet method while conveying the support, the method including: a coating film forming step of discharging a coating liquid containing a thin film forming material to a thin film formation region on the support from first to M-th line heads (M is a natural number of 2 or larger and N or smaller) among N line heads while causing the support to pass through a line head group once, the line head group including the N line heads (N is a natural number of 2 or larger) arranged to be spaced apart from each other in a conveying direction of the support, and forming a coating film in which the coating liquid deposited on the support is continuous; and a drying step of obtaining the thin film by drying the coating film. In the thin film production method, the respective N line heads are arranged to be spaced apart from each other in a support width direction, which is a direction orthogonal to the conveying direction, each of the N line heads has a plurality of thin film forming nozzle holes arrayed in the support width direction, and the first to M-th line heads are arranged sequentially upstream to downstream in the conveying direction. When a thin film forming nozzle hole array, obtained by projecting the plurality of thin film forming nozzle holes of first to m-th line heads (m is a natural number of 2 or larger and M or smaller) among the first to M-th line heads onto a virtual plane orthogonal to the conveying direction is set as an m-th thin film forming nozzle hole array, the plurality of thin film forming nozzle holes included in the m-th line head are arranged in the m-th line head so as to be positioned between adjacent thin film forming nozzle holes in an (m−1)-th thin film forming nozzle hole array. In the coating film forming step, the first line head applies the coating liquid onto the support at a plurality of discharge times, and the m-th line head applies the coating liquid onto the support at a predetermined delay time with respect to the discharge time of the first line head for each application of the coating liquid by the first line head at each of the times. The first to M-th line heads discharge the coating liquid onto the support from a thin film forming nozzle hole selected, in accordance with a shape of a thin film formation region, from among the plurality of thin film forming nozzle holes included in each of the first to M-th line heads for each of the discharge times of the first to M-th line heads.

In this case, since the first to M-th line heads are used, it is possible to increase the resolution to the thin film formation region on the support and increase an adjustment range of the coating amount as compared with those in the case of using one line head. Accordingly, it is possible to form the coating film for production of the thin film having desired pattern and thickness by causing the support to pass through the line head group including the first to M-th line heads only once. As a result, the production efficiency of the thin film is improved. Since each of the plurality of nozzle holes of the m-th line head is arranged as described above, target depositing positions of the coating liquid discharged from the plurality of nozzle holes of each of the first to M-th line heads vary in the width direction in the case of focusing on a certain discharge time among the plurality of discharge times in the first line head even when using the first to M-th line heads. Thus, it is possible to produce a uniform thin film, for example, as compared with a case where target depositing positions overlap between different line heads.

The plurality of thin film forming nozzle holes may be arranged at a pitch p in the support width direction.

In this case, each of the plurality of thin film forming nozzle holes included in the above-described second line head may be arranged centrally between adjacent thin film forming nozzle holes among the plurality of thin film forming nozzle holes included in the first line head as viewed from the conveying direction. When the coating liquid discharged from the first and second line heads is deposited on the support, the coating liquid spreads without maintaining a shape at the time of being deposited. Therefore, there is also a case where the coating liquid discharged from the plurality of thin film forming nozzle holes of the second line head is deposited on the coating liquid, which has been discharged from the plurality of thin film forming nozzle holes of the first line head and deposited and spread on the support. Even in such a case, the coating liquid is likely to spread uniformly when the coating liquid, that has been discharged from the second line head and deposited on the support, spreads as long as the plurality of thin film forming nozzle holes of the second line head are arranged as described above. As a result, unevenness derived from bias of the liquid is unlikely to occur in a coating region formed with the spread of the coating liquid deposited on the support. If the above-described unevenness in the coating region is reduced at a stage of applying the coating liquid onto the support from the second line head at the time of producing the thin film using the first to M-th line heads, it is possible to make the thickness of the thin film uniform in the state where the unevenness hardly occurs when the thin film has been produced.

A difference between a depositing position of the coating liquid discharged from the thin film forming nozzle hole of the second line head and a target depositing position set in the thin film formation region with respect to the thin film forming nozzle hole is preferably ¼ of the pitch p or smaller. When the difference between the depositing position of the coating liquid and the target depositing position is ¼ of the pitch p or smaller, it is easy to produce the uniform thin film even if the depositing position of the coating liquid deviates from the target depositing position.

The M may be any one of 2, 4, and 8. In this case, there is no unevenness derived from the liquid bias and it is easy to produce a thin film having a more uniform thickness.

The M may be 3 or larger, and the plurality of thin film forming nozzle holes of a j-th line head (j is a natural number of 3 or larger and M or smaller) among the third to M-th line heads may be arranged in the j-th line head so as to be positioned between adjacent thin film forming nozzle holes in a (j−1)-th thin film forming nozzle hole array when an interval between adjacent thin film forming nozzle holes in the (j−1)-th thin film forming nozzle hole array is an equal interval in the support width direction, and may be arranged in the j-th line head so as to be positioned between adjacent thin film forming nozzle holes having the largest interval in the (j−1)-th thin film forming nozzle hole array when the interval between the adjacent thin film forming nozzle holes in the (j−1)-th thin film forming nozzle hole array is an unequal interval in the support width direction.

When the plurality of nozzle holes of the j-th line head are arranged as described above in the mode in which M is 3 or larger, the non-uniformity of spread of the coating liquid deposited on the support as described for the second line head is unlikely to occur, and as a result, it is easy to produce the thin film having a uniform thickness without unevenness derived from the liquid bias.

When the m-th line head discharges the coating liquid at the predetermined delay time with respect to the discharge time of the first line head, the first and m-th line heads may discharge the coating liquid on the same vertical line with respect to the conveying direction.

When the m-th line head discharges the coating liquid at the predetermined delay time with respect to the discharge time of the first line head, the coating film may be discharged on different vertical lines with respect to the conveying direction.

It is preferable that the viscosity of the coating liquid is 1 mPa·s or more and 20 mPa·s or less at 25° C. Since the viscosity of the coating liquid is 1 mPa·s or more and 20 mPa·s or less, it is easy to form the coating film by using the ink jet method. When the viscosity of the coating liquid is 1 mPa·s or more and 20 mPa·s or less at 25° C., it is easy to produce the thin film having a more uniform thickness.

Each of the first to M-th line heads may include a plurality of nozzle heads, and each of the nozzle heads may have a plurality of nozzle holes arranged at a predetermined interval in the support width direction. In this case, at least some of all the plurality of nozzle holes included in the plurality of nozzle holes may be the plurality of thin film forming nozzle holes. In each of the first to M-th line heads, adjacent nozzle heads among the plurality of nozzle heads may be arranged so as to partially overlap with each other as viewed from the conveying direction. The plurality of nozzle heads, included in each of adjacent line heads among the first to M-th line heads, may be arranged such that an overlapping region of the adjacent nozzle heads in an upstream line head of the adjacent line heads in the conveying direction and an overlapping region of the adjacent nozzle heads in a downstream line head do not overlap with each other as viewed from the conveying direction.

The nozzle holes are formed in each of the nozzle heads, and the thin film forming nozzle holes among the plurality of nozzle holes included in each nozzle head discharge the coating liquid at the same time in the width direction (the support width direction) inside one nozzle head. As a result, the coating liquid having being deposited on the support at substantially the same time spread and become continuous as described above after being deposited. As a result, a continuous coating region is formed. When bias in the amount of the coating liquid occurs in this coating region, the bias is visually recognized as unevenness.

For example, when the coating liquid is applied from the thin film forming nozzle hole of the downstream nozzle head after the coating liquid is applied from the thin film forming nozzle hole of the upstream nozzle head between two adjacent nozzle heads in one line head, movement of the liquid based on such a time lag occurs so that such movement is visually recognized as connection unevenness between the nozzle heads in some cases. Further, the above-described connection unevenness part is dispersed if the overlapping region in the upstream line head and the overlapping region in the downstream line head deviate from each other as viewed from the conveying direction in the upstream line head and the downstream line head as described above, and thus, the influence of the connection unevenness between the nozzle heads is reduced, and it is easy to make the thickness of the coating film more uniform. As a result, it is possible to form the thin film having a uniform thickness in which the connection unevenness is unlikely to be visually recognized.

Such an arrangement can be realized by arranging the first to M-th line heads using a position adjustment mechanism with respect to the width direction such that the overlapping region of the adjacent nozzle heads in the upstream line head of the adjacent line heads and the overlapping region of the adjacent nozzle heads in the downstream line head do not overlap with each other as viewed from the conveying direction.

The support may have flexibility. In this case, for example, the coating film forming step and the drying step can be performed by adopting a roll-to-roll method.

An organic EL device production method according to another aspect of the present invention is a method of producing an organic EL device that includes a first electrode, a second electrode, and a thin film containing an organic light-emitting material, which is provided between the first and second electrodes, on a substrate. This production method includes: a first electrode producing step of producing the first electrode on the substrate to obtain an electrode-attached substrate; a thin film producing step of producing the thin film on the support using the organic light-emitting material as the thin film forming material and the electrode-attached substrate as the support in the above-described thin film production method according to one aspect of the present invention; and a second electrode producing step of producing the second electrode on the thin film.

In this case, the thin film containing the organic light-emitting material functions as a light-emitting layer, and the light-emitting layer can emit light as a voltage is applied to the first and second electrodes. Further, it is possible to efficiently produce the thin film containing the organic light-emitting material since the thin film containing the organic light-emitting material is produced by the above-described thin film production method according to one aspect of the present invention. As a result, the production efficiency of the organic EL device is improved.

Advantageous Effects of Invention

According to the present invention, it is possible to provide the thin film production method and the organic EL device production method that can achieve the improvement of production efficiency.

BRIEF DESCRIPTION OF DRAWINGS

FIG. 9(A) illustrates target depositing positions where the coating liquid from the plurality of nozzle holes included in the first line head is to be deposited, FIG. 9(B) illustrates target depositing positions where the coating liquid from the plurality of nozzle holes of the second line head to be deposited, FIG. 9(C) illustrates target depositing positions where the coating liquid from the plurality of nozzle holes of the third line head to be deposited, and FIG. 9(D) illustrates target depositing positions where the coating liquid from the plurality of nozzle holes of the fourth line head to be deposited.

DESCRIPTION OF EMBODIMENTS

Figure 1:
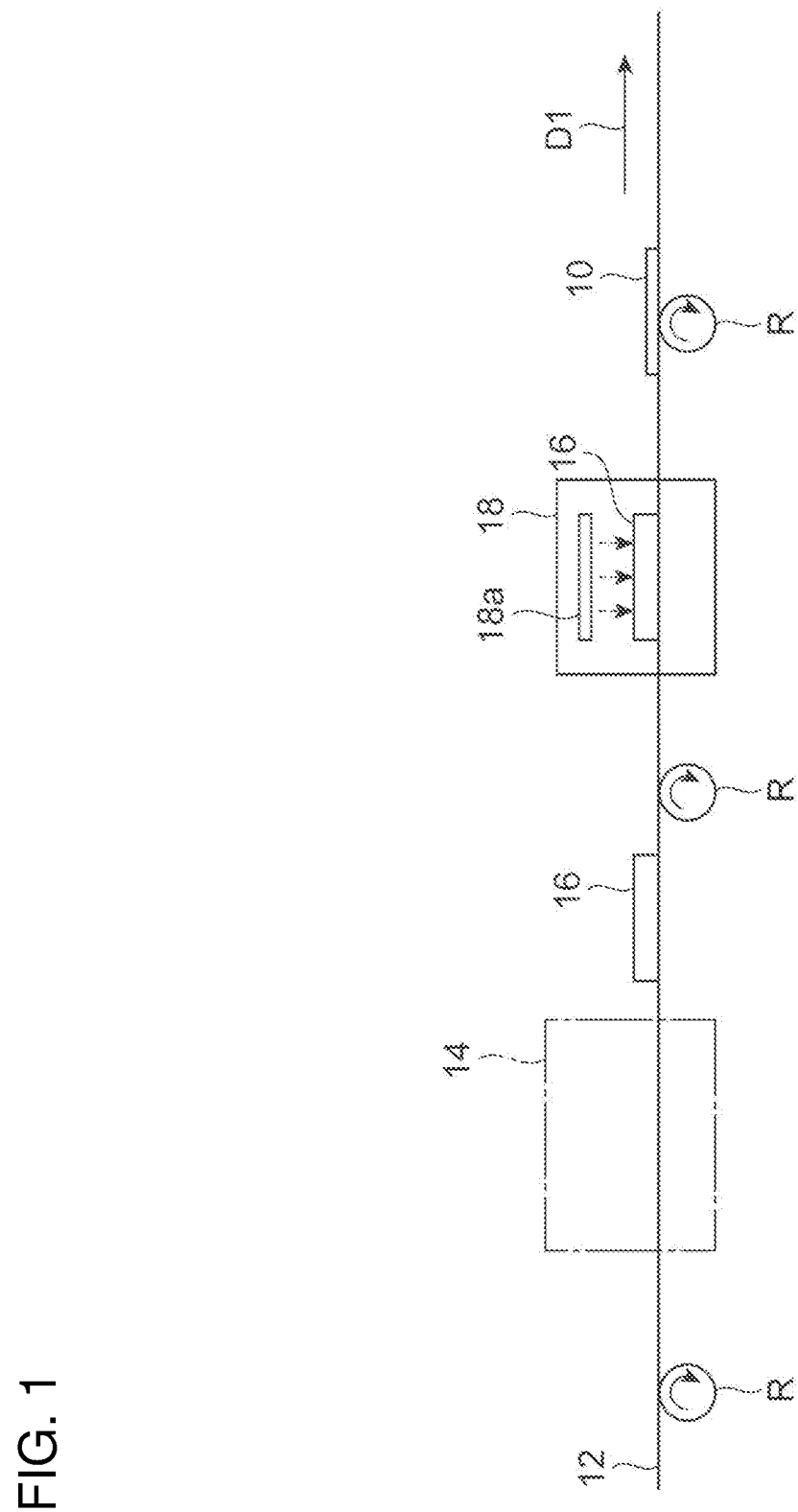
FIG. 1 is a schematic view for describing a thin film production method according to one embodiment of the present invention.

Hereinafter, embodiments of the present invention will be described with reference to the drawings. The same elements will be denoted by the same reference numerals. A redundant description thereof will be omitted. Dimensional ratios of the drawings do not always coincide with those of the description.

One aspect of the present invention relates to a thin film production method, and another aspect thereof relates to an organic electroluminescence (organic EL) device production method. First, the thin film production method will be described as a first embodiment, and the organic EL device production method will be described as a second embodiment.

First Embodiment

In the thin film production method according to the first embodiment, a thin film is produced using an ink jet method. FIG. 1 is a schematic view for describing the thin film production method produced in the first embodiment.

In the thin film production method illustrated in FIG. 1, a band-like support 12 is conveyed by a conveying unit (for example, a roller) R to pass through an ink jet apparatus 14, and a coating liquid containing a thin film forming material is discharged onto the support 12 to form a coating film 16 (a coating film forming step). The support 12 on which the coating film 16 is formed is further conveyed by the conveying unit R to pass through a drying apparatus 18, and the coating film 16 is heated with heat from a heat source 18a in the drying apparatus 18 to dry the coating film 16 (a drying step). In this drying step, a solvent contained in the coating liquid to serve as the coating film 16 is removed, and a thin film 10 is obtained on the support 12. Hereinafter, a conveying direction of the support 12 is referred to as a conveying direction D1. In FIG. 1, the support 12 is schematically illustrated, and the thicknesses of the coating film 16 and the thin film 10 are illustrated in an exaggerated manner.

It is enough that the thin film forming material for producing the thin film 10 is a material corresponding to an application of the thin film 10. The coating liquid containing the thin film forming material is a liquid in which the thin film forming material is dissolved in a solvent. The solvent is not limited as long as the solvent can dissolve the thin film forming material, and examples thereof include: chlorine-based solvents such as chloroform, methylene chloride and dichloroethane; ether-based solvents such as tetrahydrofuran; aromatic hydrocarbon-based solvents such as toluene and xylene; ketone-based solvents such as acetone and methyl ethyl ketone; ester-based solvents such as ethyl acetate, butyl acetate, and ethyl cellosolve acetate; and water. A viscosity of the coating liquid is preferably 1 mPa·s or more and 20 mPa· or less s at 25° C. The viscosity of the coating liquid is a value measured using a cone-plate type viscometer. A thickness of the thin film 10 varies depending on the application of the thin film 10, and is, for example, 10 nm to 200 nm.

The support 12 has a sheet shape extending in one direction. An example of a thickness of the support 12 is 50 μm to 200 μm. The support 12 has flexibility in the present embodiment (first embodiment). However, the support 12 does not necessarily have flexibility. In a mode in which the support 12 has flexibility, it is possible to adopt a role-to-roll method for sequentially performing the above-described coating film forming step and drying step while feeding the support 12 from a roller around which the band-like support 12 is wound and conveying the support 12 by the conveying unit to a roller for winding the support 12 therearound.

The drying apparatus 18 used in the drying process is preferably a known apparatus used in the technique of drying the coating film 16 to produce the thin film 10. An example of the drying apparatus 18 is an oven. Other examples of the drying apparatus 18 include a hot plate and a vacuum drying apparatus. A drying temperature and a drying time vary depending on components of the coating liquid, and are two minutes at 120° C., for example.

Figure 2:
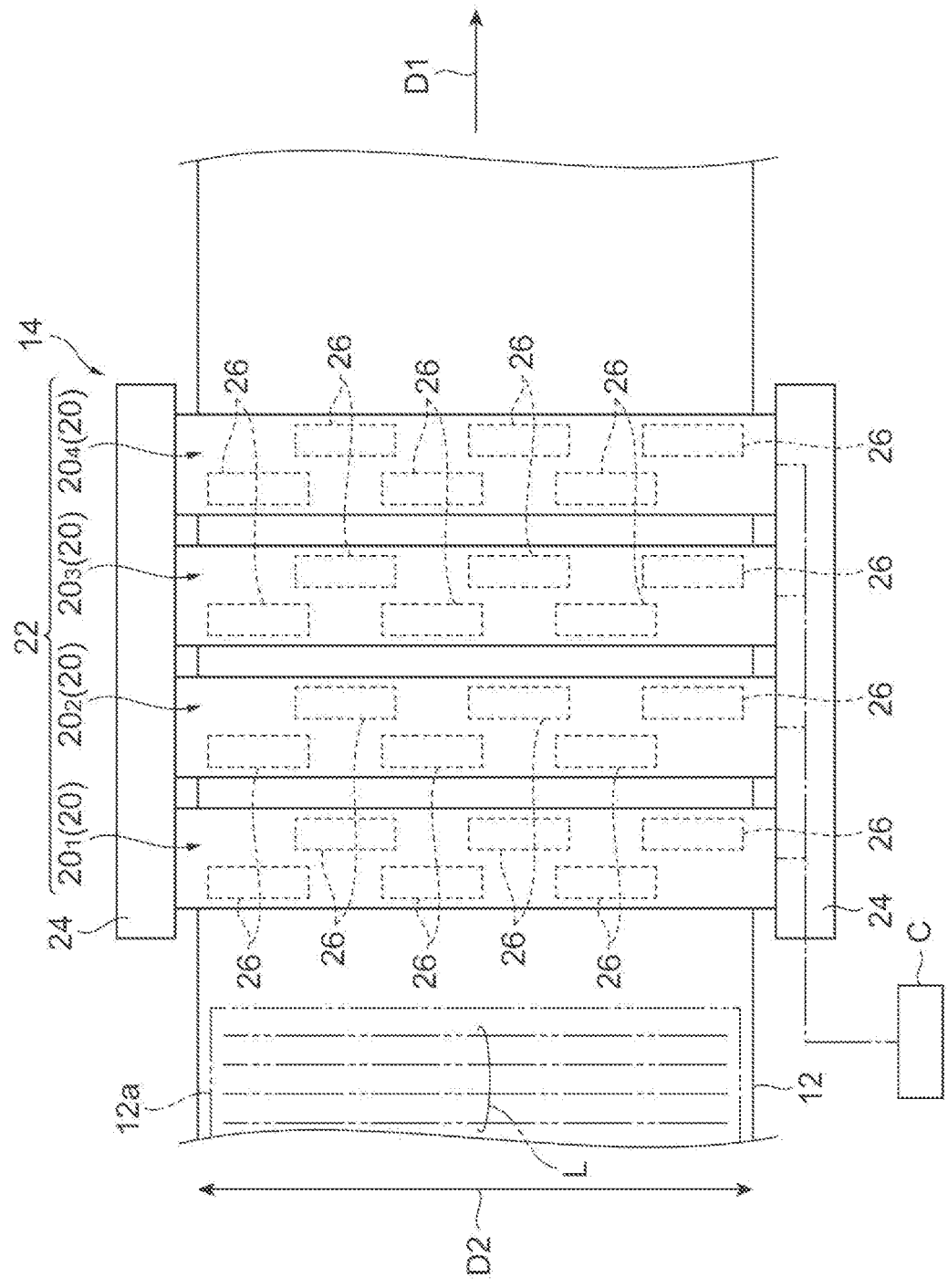
FIG. 2 is a plan view for describing a schematic configuration of an ink jet apparatus used in a coating film forming step in the thin film production method.

Next, the coating film forming step, which is a characteristic of the thin film production method in the present embodiment, will be described. FIG. 2 is a plan view for describing a schematic configuration of the ink jet apparatus 14 used in the coating film forming step. FIG. 2 illustrates the support 12 and further illustrates a thin film formation region 12a on the support 12 where the thin film 10 is to be formed and a target line L to be described later with two-dot chain lines for the sake of description. The thin film formation region 12a is substantially rectangular in the present embodiment, but it is enough that a pattern of the thin film formation region 12a is a pattern corresponding to a thin film pattern of the thin film 10. For the sake of description, a direction orthogonal to the conveying direction D1 is referred to as a width direction (support width direction) D2, and the conveying direction D1 and the width direction D2 are illustrated in the drawing. The pattern of the thin film formation region 12a has a length of 250 mm, for example, in the conveying direction D1. For example, in the case where the thin film production method of the first embodiment is applied to the organic EL device production method to be described in the second embodiment, the thin film formation region 12a is a region corresponding to a light-emittable area in an organic EL device.

The ink jet apparatus 14 is provided with a line head group 22 including N line heads 20 configured to discharge the coating liquid onto the support 12 (FIG. 2 illustrates the case of N=4). Each axis of the N line heads 20 extends in the width direction D2, the N line heads 20 are supported by a supporting frame 24 in a state where the axes thereof are parallel to each other along the conveying direction D1 of the support 12. In the present embodiment, lengths of the N line heads 20 in an axial direction (the width direction D2) are the same, but may be different from each other.

Figure 3:
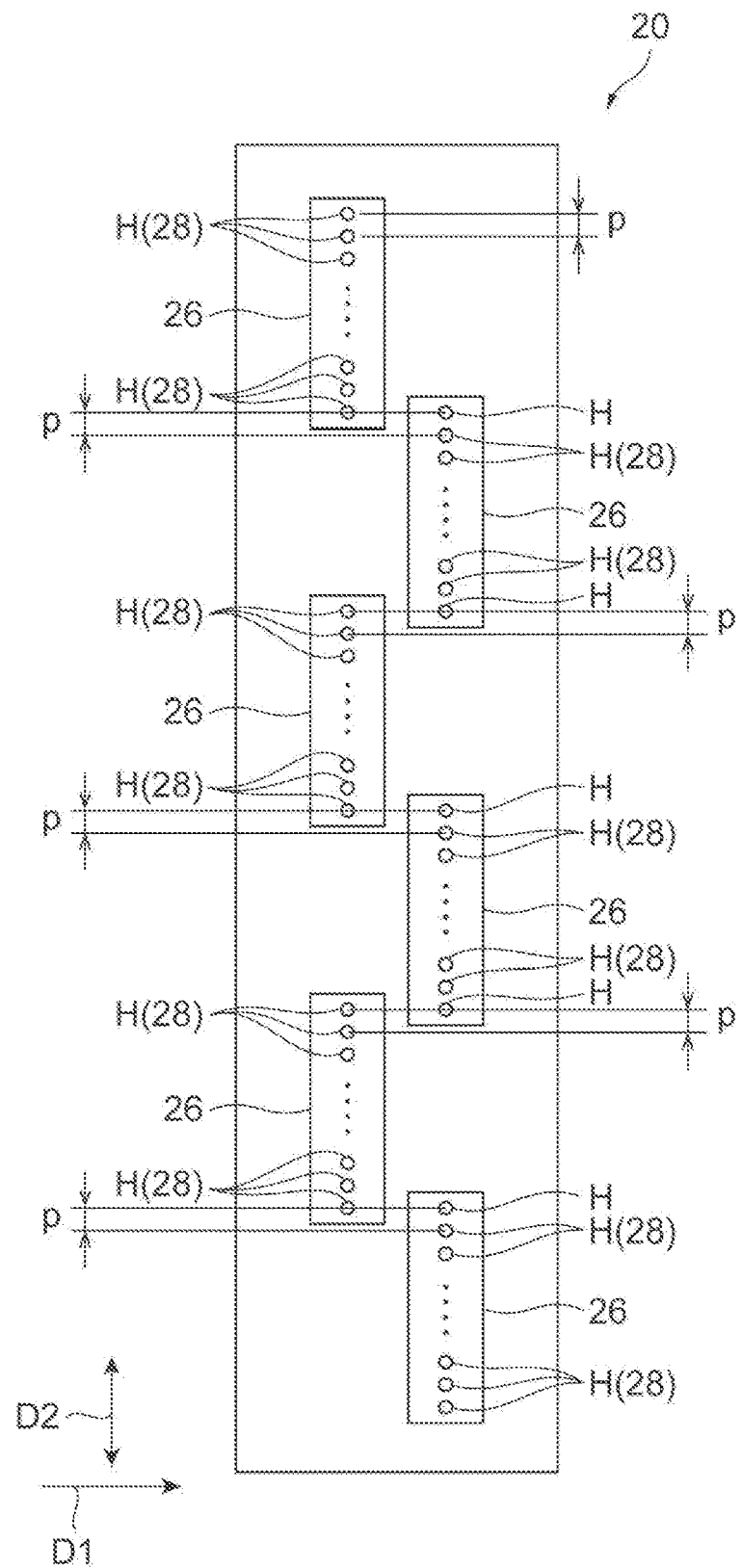
FIG. 3 is a view of the case where a line head included in the ink jet apparatus illustrated in FIG. 2 is viewed from a support side.

A basic configuration of the line head 20 will be described using FIG. 3. FIG. 3 is a view of the case where the line head 20 is viewed from the support 12 side. As illustrated in FIG. 3, the line head 20 includes a plurality of nozzle heads 26, and a plurality of nozzle holes H to discharge the coating liquid are formed in each of the nozzle heads 26 at the same pitch (predetermined interval) p along the width direction D2. An example of the pitch p is 84.5 μm.

In the nozzle heads 26 adjacent to each other among the plurality of nozzle heads 26, the nozzle holes H positioned at single ends of the adjacent nozzle heads 26 are arranged to be spaced apart from each other in the conveying direction D1 in the state of overlapping with each other as viewed from the conveying direction D1. In the present embodiment, only one of the two nozzle holes H in an overlapping portion, viewed from the conveying direction D1, in the single line head 20 is used for thin film formation. Therefore, in the present embodiment, the plurality of nozzle holes H, excluding the number of the overlapping portions viewed from the conveying direction D1 out of all the nozzle holes H of the line head 20, are to be used for thin film formation (or discharge of the coating liquid). In this manner, the nozzle hole used for thin film formation among all the nozzle holes H of the line head 20 is referred to as a nozzle hole (thin film forming nozzle hole) 28. In the example of FIG. 3, the nozzle hole H included in the upstream nozzle head 26 between the two nozzle holes H overlapping as viewed from the conveying direction D1 is illustrated as the nozzle hole 28. Since the plurality of nozzle holes H are arranged at the pitch p in each of the line heads 20 as described above, the plurality of nozzle holes 28 included in the line heads 20 are arranged at the equal pitch p in the width direction D2 even between the nozzle heads 26 with the above-described configuration.

The N line heads 20 are electrically connected to a control apparatus C as illustrated in FIG. 2. In FIG. 2, an electrical connection relationship between the control apparatus C and the line head 20 is schematically illustrated with an alternate long and short dashed line. The control apparatus C is an apparatus that controls the discharge of the coating liquid from the N line heads 20. Examples of control using the control apparatus C include selecting the line head 20 to be used for formation of the thin film 10 among the N line heads 20, selecting the nozzle holes 28 to be further used for discharging the coating film among the plurality of nozzle holes 28 of the line head 20 in accordance with a shape of the thin film 10, that is, a shape of the thin film formation region 12a, adjusting the discharge amount of the coating liquid from the nozzle hole 28, and the like. In order for the above-described control, the control apparatus C may be configured to be electrically connected to the conveying unit such that conveyance speed of the support is appropriately input. The control apparatus C is not limited as long as being an apparatus that can execute processing necessary for thin film formation. For example, the control apparatus C is not limited to a dedicated apparatus, but may be a personal computer in which thin film forming control software has been installed. Alternatively, the control apparatus C may be a control processing board that includes an FPGA in which a thin film forming control circuit is described.

In the thin film production method according to the present embodiment, the M line heads 20 selected among the N line heads 20 are used. The selection of the line head 20 to be used for production of the thin film 10 may be performed by the control apparatus C in accordance with producing conditions of the thin film 10 such as the pattern and thickness of the thin film 10. The M may be a natural number of 2 or larger, and is preferably any one of 2, 4 and 8. For the convenience of description, the M line heads 20 are referred to as a first line head $20_1$, a second line head $20_2$, ..., an (M−1)-th line head $20_{M-1}$ and an M-th line head $20_M$ in order from the upstream side. In the present embodiment, a mode of M=N will be described. An arrangement state of the plurality of nozzle holes 28 included in each of the first to M-th line heads $20_1$ to $20_M$ will be described in more detail.

The nozzle holes 28 of the first to M-th line heads $20_1$ to $20_M$ are arranged so as not to overlap with each other as viewed from the conveying direction D1. This can be realized, for example, by adjusting the arrangement state of the nozzle heads 26 in the first to M-th line heads $20_1$ to $20_M$.

With reference to the arrangement of the nozzle holes 28 of the first line head $20_1$, an arrangement relationship of the nozzle holes 28 of the second to M-th line heads $20_2$ to $20_M$ will be described using FIGS. 4 and 5. A nozzle hole array obtained by projecting the nozzle holes 28 of the first to (m−1)-th line heads $20_1$ to $20_{m-1}$, positioned on the upstream side of the m-th line head $20_m$ (m is a natural number of 2 or larger and M or smaller) among the first to M-th line heads $20_1$ to $20_M$, onto a virtual plane P orthogonal to the conveying direction D1 is referred to as an (m−1)-th nozzle hole array (thin film forming nozzle hole array) $Q_{m-1}$.

Figure 4:
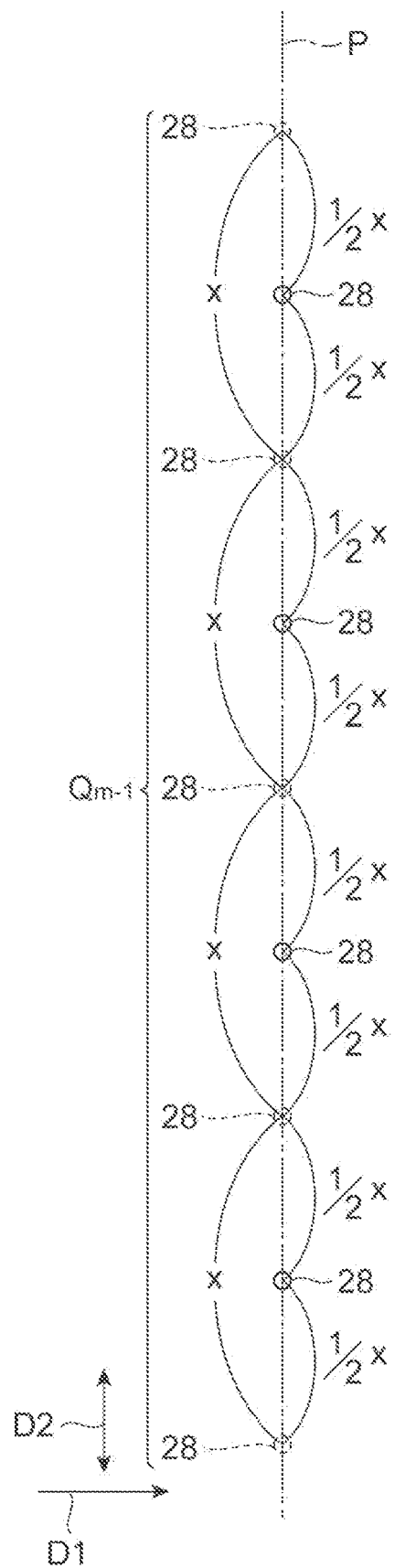
FIG. 4 is a schematic view for describing an arrangement state of a plurality of nozzle holes in an m-th line head.

FIG. 4 schematically illustrates the arrangement state on the virtual plane P of the nozzle holes 28 in the m-th line head $20_m$ when an interval between the adjacent nozzle holes 28 in the (m−1)-th nozzle hole array $Q_{m-1}$ is an equal interval. In FIG. 4, the interval between the adjacent nozzle holes 28 is represented by x. FIG. 5 schematically illustrates the arrangement state on the virtual plane P of the nozzle holes 28 in the m-th line head $20_m$ when the interval between the adjacent nozzle holes 28 in the (m−1)-th nozzle hole array $Q_{m-1}$ is an unequal interval. In FIG. 5, the interval between the adjacent nozzle holes 28 is represented by x1 and x2. In FIGS. 4 and 5, the nozzle holes 28 forming the (m−1)-th nozzle hole array $Q_{m-1}$ are illustrated with broken lines.

As illustrated in FIG. 4, when the plurality of adjacent nozzle holes 28 in the (m−1)-th nozzle hole array $Q_{m-1}$ are arranged at the equal interval, each of the plurality of nozzle holes 28 of the m-th line head $20_m$ is arranged in the m-th line head $20_m$ such that the nozzle hole 28 of the m-th line head $20_m$ is positioned at the center of the adjacent nozzle holes 28 in the (m−1)-th nozzle hole array $Q_{m-1}$.

Figure 5:
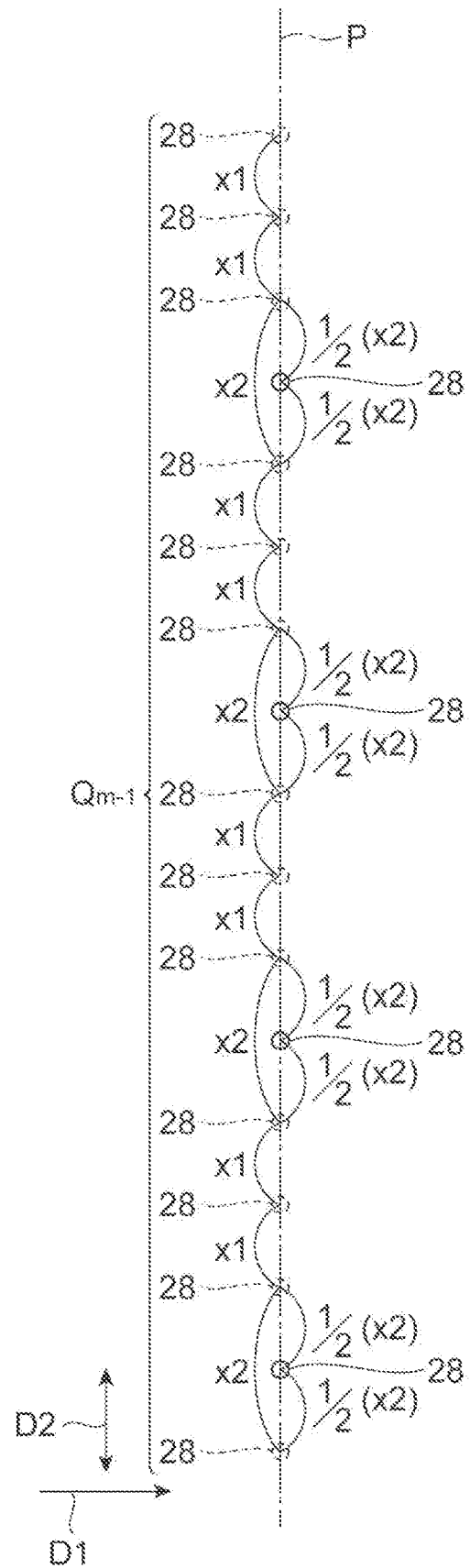
FIG. 5 is a schematic view for describing another arrangement state of the plurality of nozzle holes in the m-th line head.

On the other hand, as illustrated in FIG. 5, when the intervals among the plurality of adjacent nozzle holes 28 in the (m−1)-th nozzle hole array $Q_{m-1}$ vary, each of the plurality of nozzle holes 28 of the m-th line head $20_m$ is arranged in the m-th line head $20_m$ such that the nozzle hole 28 of the m-th line head $20_m$ is positioned at the center of the adjacent nozzle holes 28 having the largest interval among the adjacent nozzle holes 28 in the (m−1)-th nozzle hole array $Q_{m-1}$, that is, the two nozzle holes 28 separated from each other by the distance x2. In this case, the intervals among the adjacent nozzle holes 28 in the (m−1)-th nozzle hole array $Q_{m-1}$ are made more uniform.

As illustrated in FIGS. 4 and 5, one of the plurality of nozzle holes 28 of the m-th line head $20_m$ is arranged with respect to one pair of the adjacent nozzle holes 28 in the (m−1)-th nozzle hole array $Q_{m-1}$.

Figure 6:
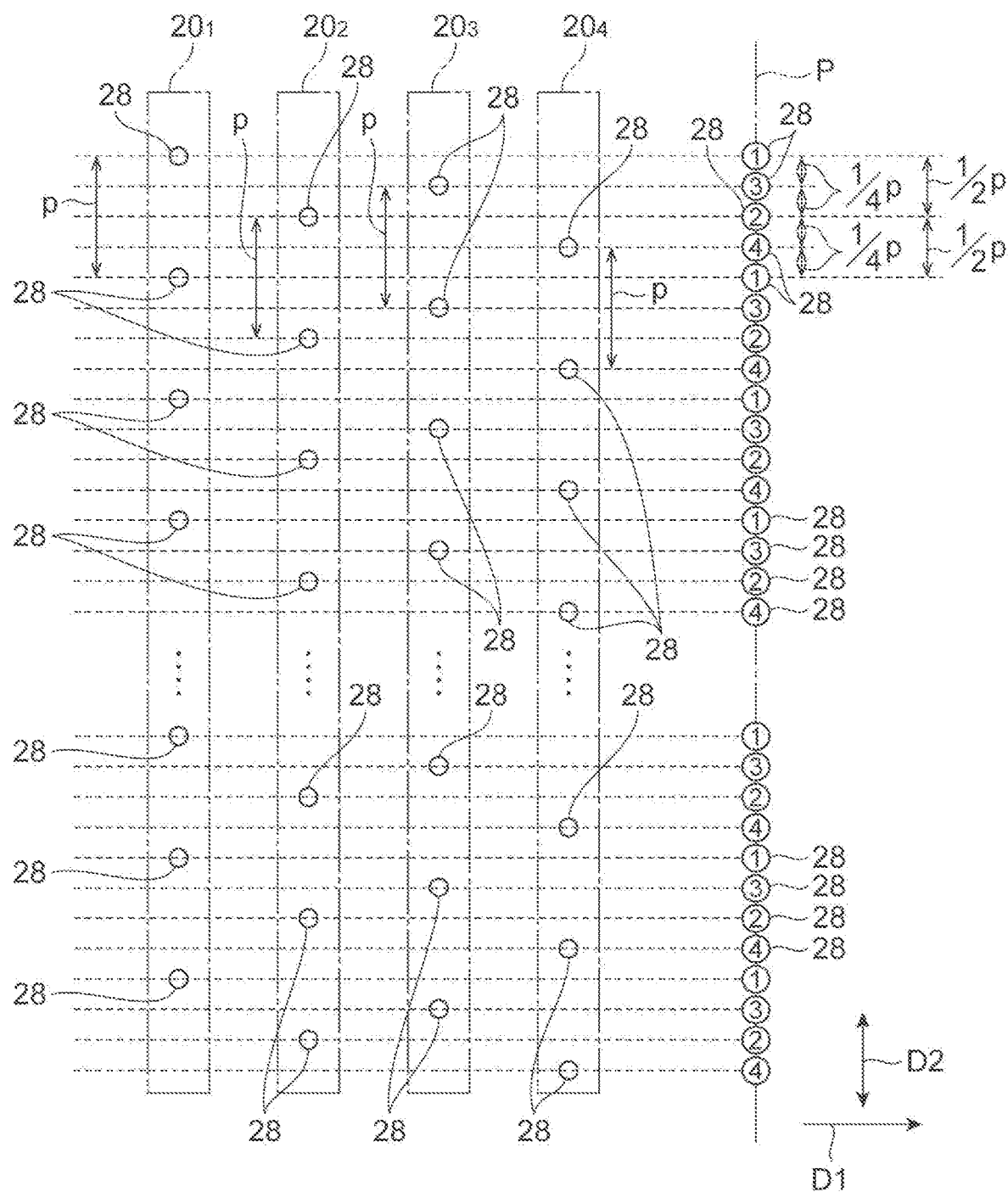
FIG. 6 is a view illustrating an example of an arrangement state of nozzle holes in first to fourth line heads.

This will be described in detail using FIG. 6. FIG. 6 is a view illustrating an example of the arrangement state of the nozzle holes 28 in the first to fourth line heads $20_1$ to $20_4$ in the case of M=4. FIG. 6 illustrates the arrangement relationship of the plurality of nozzle holes 28 in a state where it is assumed that the plurality of nozzle holes 28 are formed on one line in each of the first to fourth line heads $20_1$ to $20_4$, in order to describe the arrangement relationship of the nozzle holes 28 in the width direction D2. In FIG. 6, outer edges of the first to fourth line heads $20_1$ to $20_4$ are illustrated with alternate long and short dashed lines.

Further, FIG. 6 schematically illustrates a state where the nozzle holes 28 of the first to fourth line heads $20_1$ to $20_4$ are projected onto the virtual plane P orthogonal to the conveying direction D1. A circle (○) on the virtual plane P indicates the projected nozzle hole 28, and a number in the circle indicates that the nozzle hole 28 represented by the circle is the nozzle hole 28 that belongs to any of the first to fourth line heads $20_1$ to $20_4$. For example, a circle with "1" described therein indicates the nozzle hole 28 included in the first line head $20_1$.

For the sake of description, it is assumed that the m-th line head $20_m$ has n (n is a natural number of 2 or larger) nozzle holes 28. An example of n is 100 or larger, and 3000, for example. A position of the endmost nozzle hole 28 in the width direction D2 in the first nozzle hole array formed of the n nozzle holes 28 of the first line head $20_1$ is set as a reference position in the width direction D2. In this case, each position of the nozzle holes 28 of the first line head $20_1$ in the width direction D2 with respect to the reference position is represented by (p×k) (k is an integer of 0 or larger and n or smaller). In FIG. 6, the first nozzle hole array is a nozzle hole array formed only of the plurality of nozzle holes 28 of the first line head $20_1$.

Since the plurality of nozzle holes 28 included in the first line head $20_1$ are arranged at equal intervals, the interval between the adjacent nozzle holes 28 in a first nozzle hole array $Q_1$ is also an equal interval. In FIG. 6, the first nozzle hole array $Q_1$ is a nozzle hole array formed of circles each of which has "1" described therein. Accordingly, each of the plurality of nozzle holes 28 in the second line head $20_2$ is arranged so as to be positioned centrally between the adjacent nozzle holes 28 in the first nozzle hole array as illustrated in FIG. 6. In this case, each of the nozzle holes 28 in the second line head $20_2$ is represented by (p×(k+½)) with respect to the reference position in the width direction D2. Although the illustration of the reference sign "$Q_1$" indicating the first nozzle hole array $Q_1$ is omitted from the viewpoint of viewability of the drawing in FIG. 6, the nozzle hole array formed of the circles each of which has "1" described therein is the first nozzle hole array $Q_1$ as described above. Hereinafter, the illustration of reference signs "$Q_2$" and "$Q_3$" of second and third nozzle hole arrays $Q_2$ and $Q_3$, which will be described later, is also omitted in the description using FIG. 6 from the same viewpoint.

The interval between the adjacent nozzle holes 28 is also the equal interval in the second nozzle hole array $Q_2$ formed of the nozzle holes 28 of the first and second line heads $20_1$ and $20_2$, that is, a nozzle hole array formed of circles with "1" and "2" described therein in FIG. 6. Accordingly, each of the plurality of nozzle holes 28 in the third line head $20_3$ is arranged so as to be positioned centrally between the adjacent nozzle holes 28 in the second nozzle hole array $Q_2$. Since the plurality of nozzle holes 28 are also arranged at the pitch p in the third line head $20_3$, each of the nozzle holes 28 of the third line head $20_3$ is arranged at a position represented by (p×(k+½−¼)) or (p×(k+½+¼)) with respect to the reference position in the width direction D2. FIG. 6 illustrates the case where each of the nozzle holes 28 of the third line head $20_3$ is arranged at the position of (p×(k+½−¼)).

The interval between the adjacent nozzle holes 28 varies in the third nozzle hole array $Q_3$ formed of the nozzle holes 28 of the first to third line heads $20_1$ to $20_3$, that is, a nozzle hole array formed of circles with "1", "2", and "3" described therein in FIG. 6. That is, the third line head $20_3$ may be present or absent between the nozzle holes 28 of the first and second line heads $20_1$ and $20_2$ in the third nozzle hole array $Q_3$, and as a result, the interval of the adjacent nozzle holes 28 in the third nozzle hole array $Q_3$ varies. Accordingly, each of the plurality of nozzle holes 28 in the fourth line head $20_4$ is arranged between the adjacent nozzle holes 28 with a wider interval among the plurality of adjacent nozzle holes 28 in the third nozzle hole array $Q_3$.

Specifically, each of the plurality of nozzle holes 28 in the fourth line head $20_4$ is arranged centrally between a region where the third line head $20_3$ is not arranged between the nozzle holes 28 of the first and second line heads $20_1$ to $20_3$, in the third nozzle hole array $Q_3$. Therefore, when each of the nozzle holes 28 of the third line head $20_3$ is positioned at $(p \times (k+\frac{1}{2}-\frac{1}{4}))$ in the width direction D2, each of the nozzle holes 28 of the fourth line head $20_4$ is arranged at the position represented by $(p \times (k+\frac{1}{2}+\frac{1}{4}))$. On the other hand, each of the nozzle holes 28 of the fourth line head $20_4$ is arranged at the position represented by $(p \times (k+\frac{1}{2}-\frac{1}{4}))$ when each of the nozzle holes 28 of the third line head $20_3$ is positioned at $(p \times (k+\frac{1}{2}+\frac{1}{4}))$.

Next, a method of forming a coating film using the ink jet apparatus 14 will be described. In the case of forming the coating film, the support 12 is caused to pass below the line head group 22 formed of the first to M-th line heads $20_1$ to $20_M$ once to form the coating film 16.

The description will be given in detail. In the case of forming the coating film, the first line head $20_1$ discharges a coating liquid to the thin film formation region 12a at a plurality of discharge times controlled by the control apparatus C. Each discharge time can be appropriately set in accordance with the length of the thin film formation region 12a in the conveying direction, the conveyance speed of the support, and the like.

Specifically, the discharge time is set such that the coating liquid can be discharged to the plurality of target lines L (see FIG. 2) set in advance in the thin film formation region 12a. Each of the target lines L is a line (vertical line) vertical to the conveying direction, and the plurality of target lines L are arranged at a predetermined interval with respect to the conveying direction. The target line L is a virtual line set by the control apparatus C. The discharge time is determined using the conveyance speed of the support 12 so as to discharge the coating liquid from the first line head $20_1$ toward the target line L when each of the target lines L passes below the first line head $20_1$.

The above-described discharge time is a time to cause the coating liquid to to be deposited on the single target line L for the first line head $20_1$. As described above, the nozzle heads 26, adjacent to each other in the width direction D2 among the plurality of nozzle holes 26 included in the first line head $20_1$, are arranged to be spaced apart from each other in the conveying direction D1. Thus, when discharging the coating liquid from the nozzle hole 28 of the first line head $20_1$, the upstream nozzle head 26 and the downstream nozzle head 26 of the two nozzle heads 26 spaced apart from each other in the conveying direction D1 discharge the coating liquid at slightly shifted times such that the coating liquid therefrom are deposited on the same target line. Accordingly, the above-described discharge time is a concept that also includes the deviation between the discharge time from the nozzle hole 28 included in the upstream nozzle head 26 and the discharge time from the downstream nozzle head 26. The deviation in the discharge times of the coating liquid between the upstream nozzle head 26 and the downstream nozzle head 26 can be also controlled by the control apparatus C. The same meaning of the discharge time is applied for discharge times in the second to M-th line heads $20_2$ to $20_M$.

When the first line head $20_1$ discharges the coating liquid at a certain discharge time (hereinafter referred to as a "discharge time T"), the second to M-th line heads $20_2$ to $20_M$ discharge the coating liquid to the thin film formation region 12a at each corresponding delay time under the control of the control apparatus C. In the present embodiment, the above-described delay time is a time at which the target line L corresponding to the discharge time T of the first line head $20_1$ passes below the second to M-th line heads $20_2$ to $20_M$, that is, a time at which the coating liquid can be caused to be deposited on the target line L, on which the coating liquid from the first line head $20_1$ has been deposited, sequentially by the second to M-th line heads $20_2$ to $20_M$.

When the first to M-th line heads $20_1$ to $20_M$ discharge the coating liquid at the respective discharge times, the first to M-th line heads $20_1$ to $20_M$ discharge the coating liquid from the nozzle hole 28 selected in accordance with the shape of the thin film formation region 12a among the plurality of nozzle holes 28 of the first to M-th line heads $20_1$ to $20_M$ under the control of the control apparatus C.

Here, an arrangement relationship among target depositing positions on the single target line L of the coating liquid from the nozzle holes 28 will be described by exemplifying the case where the coating liquid is discharged from all the nozzle holes 28 included in the first to M-th line heads $20_1$ to $20_M$. The above-described "target depositing position" is a position in the case of assuming that the coating liquid has been discharged from the nozzle hole 28 as designed and the coating liquid has been deposited on the target line L. Accordingly, an arrangement relationship among the target depositing positions of the nozzle holes 28 corresponds to the arrangement relationship among the nozzle holes 28.

The first line head $20_1$ is positioned on the most upstream side among the first to M-th line heads $20_1$ to $20_M$, and thus, is arranged without being affected by the arrangement relationship of the nozzle holes 28 of the m-th line head $20_m$. Accordingly, the target depositing positions corresponding to the plurality of nozzle holes 28 of the first line head $20_1$ are arranged such that the target depositing positions are arranged at the pitch p on the target line L as in the arrangement of the nozzle holes 28 of the first line head $20_1$.

Next, an arrangement state of target depositing positions corresponding to the plurality of nozzle holes 28 included in the m-th line head $20_m$ will be described using FIGS. 7 and 8.

Hereinafter, the target depositing positions corresponding to the plurality of nozzle holes 28 of the m-th line head $20_m$ are referred to as target depositing positions $30_m$ for the sake of description. A target depositing position group formed of a plurality of target depositing positions $30_1$ to $30_m$ corresponding to the plurality of nozzle holes 28 of the first to m-th line heads $20_1$ to $20_m$ is referred to as an m-th target depositing position group $G_m$. Accordingly, a target depositing position group formed of the plurality of target depositing positions $30_1$ to $30_{m-1}$ corresponding to the plurality of nozzle holes 28 of the first to (m−1)-th line heads $20_1$ to $20_{m-1}$, which are positioned on the upstream side of the m-th line head $20_m$, is an (m−1)-th target depositing position group $G_{m-1}$. In addition, the plurality of target depositing positions $30_1$ to $30_{m-1}$ included in the (m−1)-th target depositing position group $G_{m-1}$ are simply referred to as a target depositing position g.

In the following description, the same notation is also adopted for the target depositing positions corresponding to the plurality of nozzle holes 28 of the first line head $20_1$. That is, the target depositing positions corresponding to the plurality of nozzle holes 28 of the first line head $20_1$ are represented by target depositing positions $30_1$, and a target depositing position group formed of the plurality of target depositing positions $30_1$ is represented by a first target depositing position group $G_1$.

Figure 7:
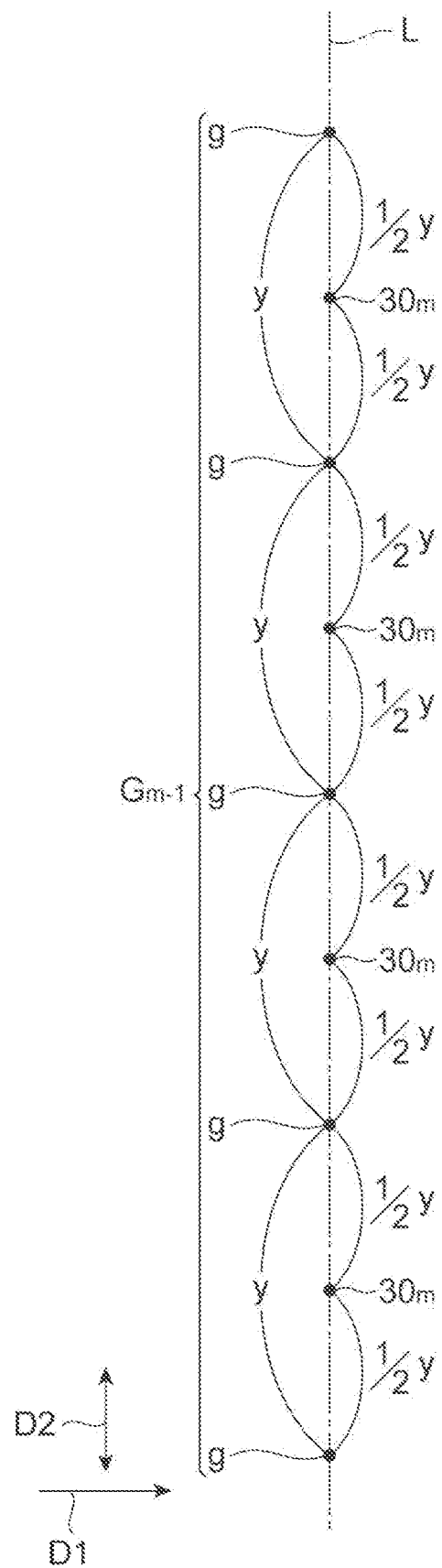
FIG. 7 is a schematic view for describing an arrangement state of a plurality of target depositing positions corresponding to the plurality of nozzle holes included in the m-th line head.

FIG. 7 schematically illustrates the arrangement state of the target depositing positions $30_m$ when an interval between the adjacent target depositing positions g is an equal interval in the (m−1)-th target depositing position group $G_{m−1}$. In FIG. 7, the interval between the adjacent target depositing positions g in the (m−1)-th target depositing position group $G_{m−1}$ is represented by y. FIG. 8 schematically illustrates the arrangement state of the target depositing positions $30_m$ when the interval between the adjacent target depositing positions g is an unequal interval in the (m−1)-th target depositing position group $G_{m−1}$.

As illustrated in FIG. 7, when the interval between the adjacent target depositing positions g is the equal interval in the (m−1)-th target depositing position group $G_{m−1}$, the target depositing position $30_m$ corresponding to each of the plurality of nozzle holes 28 of the m-th line head $20_m$ is positioned centrally between the adjacent target depositing positions g on the target line L.

Figure 8:
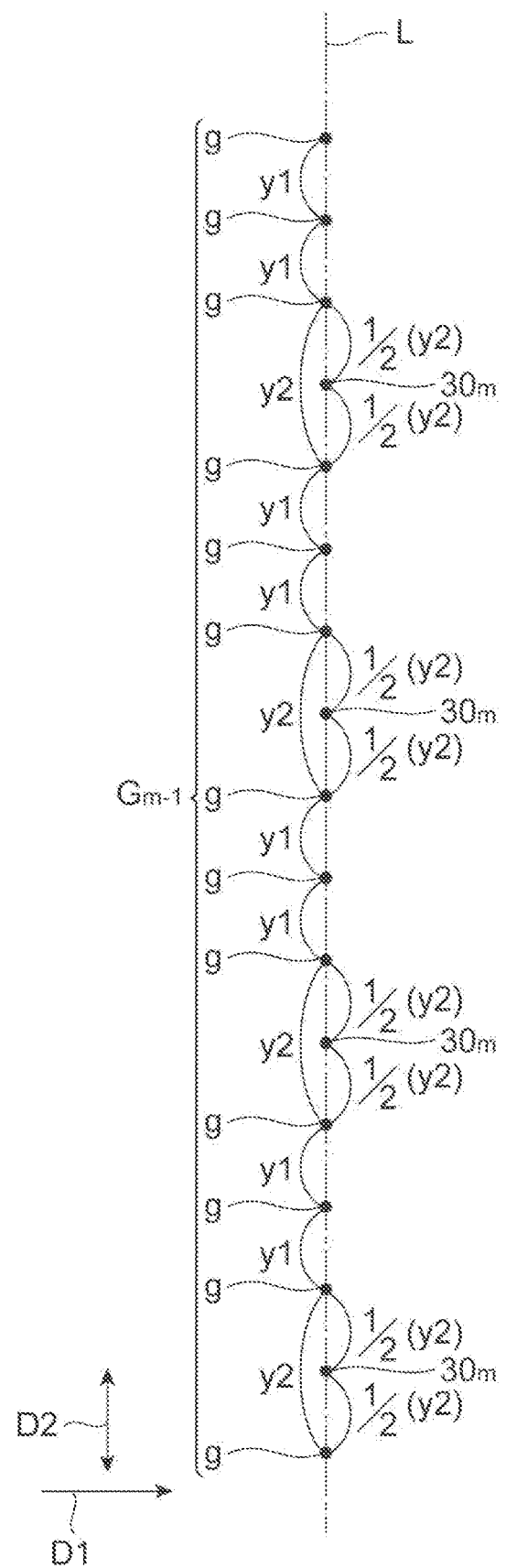
FIG. 8 is a schematic view for describing another arrangement state of the plurality of target depositing positions corresponding to the plurality of nozzle holes included in the m-th line head.

As illustrated in FIG. 8, when the interval between the adjacent target depositing positions g is the unequal interval in the (m−1)-th target depositing position group $G_{m−1}$, the target depositing position $30_m$ corresponding to each of the plurality of nozzle holes 28 of the m-th line head $20_m$ is positioned centrally between the adjacent target depositing positions g with the largest interval, that is, the two target depositing positions g separated from each other by a distance y2 on the target line L among the adjacent target depositing positions g in the (m−1)-th target depositing position group $G_{m−1}$. In this case, the intervals among the adjacent target depositing positions g in the (m−1)-th target depositing position group $G_{m−1}$ are made more uniform.

A method of discharging the coating liquid from the first to fourth line heads $20_1$ to $20_4$ in the case of M=4 will be specifically described using the target depositing positions $30_1$ to $30_4$. Here, the description will be given by exemplifying the case where the coating liquid is discharged from all the nozzle holes 28 of the first to fourth line heads $20_1$ to $20_4$. FIGS. 9(a) to 9(d) illustrate the target depositing positions $30_1$ to $30_4$ onto which the plurality of nozzle holes 28 of the first to fourth line heads $20_1$ to $20_4$ cause the coating liquid to be deposited when the thin film formation region 12a on the support 12 passes below the first to fourth line heads $20_1$ to $20_4$. In FIGS. 9(a) to 9(d), the illustration of the first to fourth line heads $20_1$ to $20_4$ is omitted.

Figure 9A:
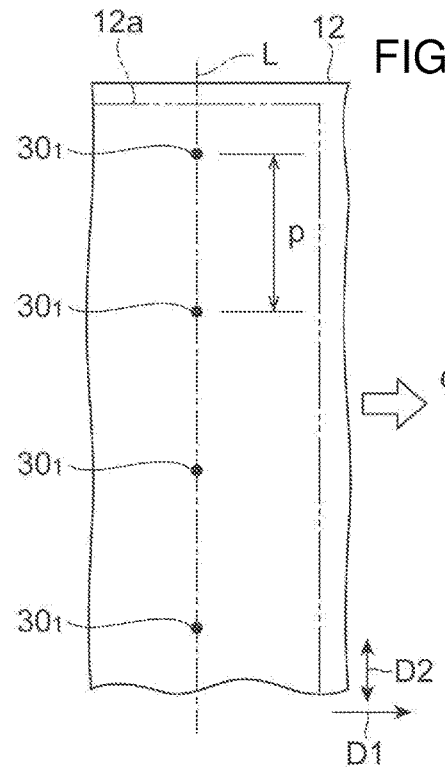
FIGS. 9(A)-9(D) are views for describing a method of discharging a coating liquid from the plurality of nozzle holes included in each of the first to fourth line heads when the coating liquid is discharged from the first to fourth line heads toward the support.

When the thin film formation region 12a of the support 12 is conveyed to the line head group 22, the plurality of nozzle holes 28 of the first line head $20_1$ discharge the coating liquid toward the target depositing positions $30_1$ on the target line L inside the thin film formation region 12a. Since the first line head $20_1$ is positioned on the most upstream side among the first to fourth line heads $20_1$ to $20_4$ in the conveying direction D1 of the support 12, the target depositing positions $30_1$ of the plurality of nozzle holes 28 included in the first line head $20_1$ are set to correspond to the arrangement relationship of the plurality of nozzle holes 28 in the width direction D2 as illustrated in FIG. 9(A). That is, the plurality of target depositing positions $30_1$ are arranged at the pitch p on the target line L.

Figure 9C:
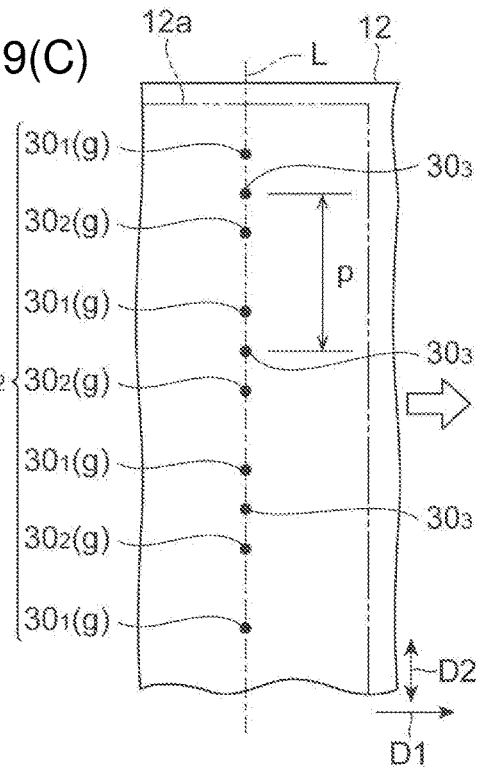
Figure 9B:
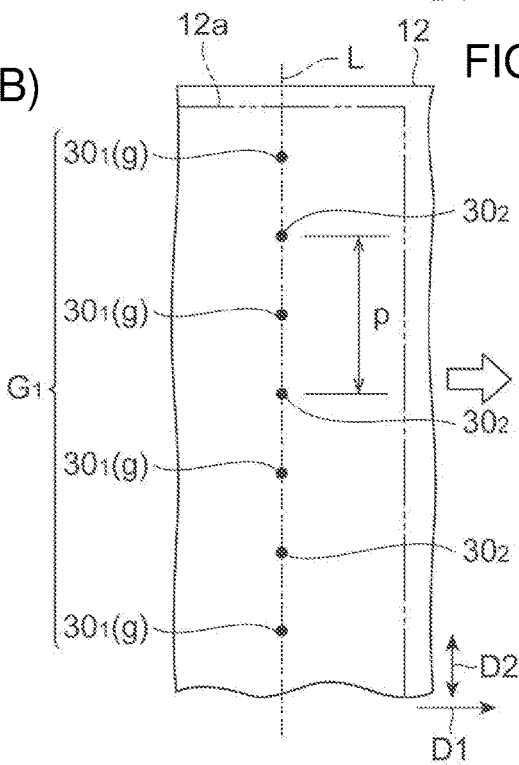

When the support 12 is conveyed and the target line L is positioned below the second line head $20_2$, the plurality of nozzle holes 28 of the second line head $20_2$ discharge the coating liquid toward the target depositing positions $30_2$ illustrated in FIG. 9(B). Specifically, based on the arrangement relationship of the nozzle holes 28 in the first and second line heads $20_1$ and $20_2$, the plurality of nozzle holes 28 of the second line head $20_2$ discharge the coating liquid centrally between the adjacent target depositing positions $30_1$ on the target line L as the target depositing positions $30_2$.

When the support 12 is conveyed and the target line L is positioned below the third line head $20_3$, the plurality of nozzle holes 28 of the third line head $20_3$ discharge the coating liquid toward the target depositing positions $30_3$ illustrated in FIG. 9(C). Specifically, based on the arrangement relationship of the plurality of nozzle holes 28 in the first to third line heads $20_1$ and $20_3$, the plurality of nozzle holes 28 of the third line head $20_3$ discharge the coating liquid centrally between the adjacent target depositing positions g in the second target depositing position group $G_2$ on the target line L as the target depositing positions $30_3$.

Meanwhile, the plurality of target depositing positions $30_3$ are arranged at the pitch p, but the distance between the adjacent target depositing positions g is p/2. Here, when the target depositing position $30_3$ is positioned centrally on the one end side in the width direction D2, the target depositing positions $30_3$ are sequentially arranged with the pitch p therefrom. Therefore, the target depositing position g included in the second target depositing position group $G_2$ and the target depositing position $30_3$, adjacent to each other, are arranged at the unequal interval, and the distance between the target depositing position g and the target depositing position $30_3$, adjacent to each other, is p/2 or p/4 as illustrated in FIG. 9(C).

Figure 9D:
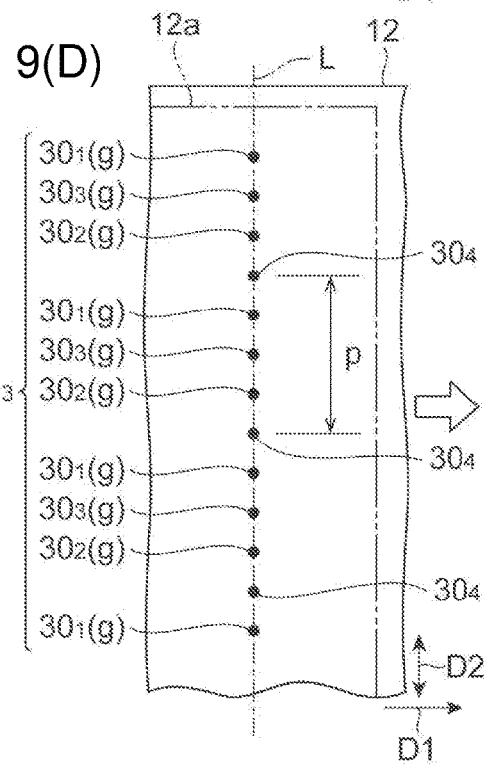

When the support 12 is further conveyed and the target line L is positioned below the fourth line head $20_4$, the plurality of nozzle holes 28 of the fourth line head $20_4$ discharge the coating liquid toward the target depositing positions $30_4$ illustrated in FIG. 9(D). Specifically, based on the arrangement relationship of the plurality of nozzle holes 28 of the first to fourth line heads $20_1$ to $20_4$, the plurality of nozzle holes 28 of the fourth line head $20_4$ discharge the coating liquid centrally between the adjacent target depositing positions g having the largest interval, that is, at the adjacent target depositing positions g with the interval of p/2 in a third target depositing position group $G_3$ on the target line L as the target depositing positions $30_4$. As a result, a distance between each of the adjacent target depositing positions g having the interval of p/2 and the target depositing position $30_4$ arranged therebetween is p/4.

The method of discharging the coating liquid of the first to fourth line heads $20_1$ to $20_4$ has been described while specifically exemplifying the target depositing positions $30_1$ to $30_4$ using FIGS. 9(a) to 9(d). Meanwhile, the coating liquid spreads when deposited on the support 12. For example, even if a diameter of the coating liquid immediately after being deposited is 42 μm or smaller, the coating liquid spreads up to 42 μm or larger to have a film shape. Thus, the coating liquids, which have been discharged from the adjacent nozzle holes 28 in the first to fourth line heads $20_1$ to $20_4$ and deposited on the support 12, become continuous during the conveyance of the support 12. Accordingly, for example, the coating liquid, which has been discharged from the adjacent nozzle holes 28 in the first line head $20_1$ and deposited on the support 12, is conveyed below the second line head $20_2$ in the state of being continuous to some extent. Thus, when the single target line L passes below the first to fourth line heads $20_1$ to $20_4$, a continuous coating liquid region (coating liquid line) is formed on the target line L. Here, if the liquid is sufficiently leveled, the uniform coating film without irregularities is obtained.

Although the description has been given hereinabove by focusing on the single target line L, the plurality of target lines L, spaced apart from each other in the conveying direction D1, are set in the thin film formation region 12a as described above, and the coating liquid line is formed on each of the target lines L in the thin film production method. Since the coating liquid spreads when deposited on the support 12, the coating liquid lines corresponding to the plurality of target lines L become further continues to form the coating film 16. Thus, it is enough that a spacing interval between the plurality of target lines L is set to a spacing distance to the extent that the coating liquid on the adjacent target lines L become continues in consideration of a spreading state of the coating liquid after being deposited in accordance with liquid properties such as the viscosity and surface tension of the coating liquid.

The description of the method of discharging the coating liquid to the support 12 using FIGS. 9(a) to 9(d) has been described in terms of the target depositing positions $30_1$ to $30_4$. However, the arrangement relationship of the target depositing positions $30_1$ to $30_4$ corresponds to the arrangement relationship of the corresponding nozzle holes 28. Accordingly, in the ink jet apparatus 14, it is possible to cause the coating liquid to be deposited on the target depositing positions $30_1$ to $30_4$ illustrated in FIGS. 9(a) to 9(d) by discharging the coating liquid directly downward (in a direction orthogonal to the conveying direction D1 and the width direction D2) from the plurality of nozzle holes 28 included in each of the first to fourth line heads $20_1$ to $20_4$ at fixed delay times in the order of the first to fourth line heads $20_1$ to $20_4$ in consideration of the conveyance speed of the support 12.

Further, the coating liquid lines are formed with respect to the plurality of target lines L described above by discharging the coating liquid to the support 12 from the first line head $20_1$ at fixed time intervals in consideration of the conveyance speed of the support 12, and the coating film 16 is obtained as the coating liquid lines become continuous.

Further, when the first to M-th line heads $20_1$ to $20_M$ discharge the coating liquid at the respective discharge times, the first to M-th line heads $20_1$ to $20_M$ discharge the coating liquid from the nozzle holes 28 selected, in accordance with the shape of the thin film formation region 12a, from among the plurality of nozzle holes 28 of the first to M-th line heads $20_1$ to $20_M$, so that the coating film 16 corresponding to the pattern of the thin film formation region 12a is obtained.

Although the case of M=4 has been described in FIGS. 9(a) to 9(d), the same description is also applied in the case where M is other than 4, for example, the case where M is larger than 4.

Since the first to M-th line heads $20_1$ to $20_M$ are used in the above-described thin film production method, it is possible to perform coating toward the thin film formation region 12a on the support 12 with finer resolution than in the case of using one line head, and the coating film 16 is likely to have a more uniform thickness. Accordingly, the unevenness derived from the liquid bias is reduced by causing the support 12 to pass through the line head group 22, formed of the first to M-th line heads $20_1$ to $20_M$, only once, and it is possible to form the coating film for production of the thin film having a uniform and desired thickness. As a result, the quality of the thin film is improved as compared with the case of using one line head. In addition, since the first to M-th line heads are used, it is possible to increase an adjustment range of the coating amount while increasing the resolution as described above. In addition, it is easy to deal with a desired pattern. As a result, it is possible to form the coating film for production of the thin film having desired pattern and thickness by causing the support 12 to pass through the line head group including the first to M-th line heads only once, and thus, the production efficiency of the thin film is improved.

In the first to M-th line heads $20_1$ to $20_M$, the plurality of nozzle holes 28 involved in the thin film formation are arranged so as not to overlap with each other as viewed from the conveying direction D1, and the target depositing positions g forming the M-th target depositing position group $G_M$ are also arranged to be spaced apart from each other in the width direction D2. Thus, it is possible to drop the coating liquid onto the single target line L with high resolution. Accordingly, it is easy to form the thin film 10 having a uniform thickness without any liquid bias.

Further, the plurality of nozzle holes 28 included in each of the first to M-th line heads $20_1$ to $20_M$ are arranged at the pitch p in the width direction D2 in the present embodiment. Further, the nozzle holes 28 of the m-th line head $20_m$ are arranged as described with reference to FIGS. 4 and 5. As a result, the arrangement relationship of the target depositing positions $30_1$ to $30_M$ as illustrated in FIGS. 7 and 8 is realized with respect to the single target line L. In other words, the plurality of nozzle holes 28 realizing the arrangement relationship of the target depositing positions $30_1$ to $30_M$ as illustrated in FIGS. 7 and 8 are arranged.

In this case, since the interval between the adjacent target depositing positions g is the same in the first target depositing position group $G_1$ formed of the plurality of target depositing positions $30_1$ corresponding to the first line head $20_1$, each of the plurality of target depositing positions $30_2$ is set centrally between the adjacent target depositing positions g in the first target depositing position group $G_1$.

As described above, the coating liquid, which has been discharged from the first line head $20_1$ and deposited on the support 12, spreads after being deposited. Thus, there is a case where the coating liquid, which has been discharged from the second line head $20_2$ toward the target depositing position $30_2$, is applied onto the coating liquid discharged from the first line head $20g$. In such a case, for example, if the target depositing position $30_2$ is biased toward one of the adjacent target depositing positions g in the width direction D2, the liquid contacts the closer target depositing position g and is sucked in one direction when the coating liquid having been discharged from the second line head $20_2$ and deposited on the support 12 spreads. As a result, streak unevenness occurs because the coating film becomes continuous in a state where a difference in thickness is caused due to the suction of the liquid on the target line L as compared with the case of setting the target depositing position $30_2$ centrally between the adjacent target depositing positions g. Further, if the unevenness occurs at the stage where the target line L has passed below the second line head $20_2$, the unevenness also remains or is also emphasized in and after the third line head $20_3$. As a result, the streak that can be visually recognized at the time of light emission remains.

On the other hand, if the target depositing positions $30_m$ of the m-th line head $20_m$ are set with respect to the (m−1)-th target depositing position group $G_{m-1}$ in accordance with the arrangement state of the nozzle holes 28 as described with reference to FIGS. 7 and 8, each of the plurality of target depositing positions $30_2$ corresponding to the second line head $20_2$ is set at the center of the adjacent target depositing positions g in the first target depositing position group $G_1$ as described above. Accordingly, it is easy to produce the thin film 10 having a more uniform thickness without any streak.

The difference between the depositing position of the coating liquid on the support 12 from the nozzle hole 28 of the second line head $20_2$ and the target depositing position $30_2$ is preferably ¼ of the pitch p or smaller which is the distance between adjacent nozzle holes 28. There is a case where a depositing position of the coating liquid deviates from the target depositing position $30_2$ at the time of actually producing the thin film 10, but it is possible to produce the thin film 10 having a more uniform thickness by adjusting installation conditions of the ink jet apparatus 14, the conveying unit of the support 12 or the like such that the deviation falls within the above-described range.

If the target depositing positions $30_m$ of the m-th line head $20_m$ are set as described using FIGS. 7 and 8, (in other words, the nozzle holes 28 of the m-th line head $20_m$ are arranged as described in FIGS. 4 and 5) in the mode where M is 3 or larger, each of a plurality of target depositing positions $30_j$ corresponding to the plurality of nozzle holes 28, included in a j-th line head $20_j$ (j is a natural number of 3 or larger and M or smaller) among the third to M-th line heads $20_3$ to $30_M$ is also set centrally between the adjacent target depositing positions g in each of (j−1)-th target depositing position groups $G_{j-1}$. Thus, the non-uniformity of spread of the coating liquid having been deposited on the support 12 as described with respect to the second line head $20_2$ is unlikely to occur, and as a result, it is possible to produce the thin film 10 having a uniform thickness without any streak.

When an interval between the adjacent target depositing positions g in each of the (j−1)-th target depositing position groups $G_{j-1}$ is an equal interval in accordance with the arrangement of the nozzle holes 28 of the first to (j−1)-th line heads, the target depositing position $30_j$ is positioned centrally between the adjacent target depositing position g. When the interval between the adjacent target depositing positions g in each of the (j−1)-th target depositing position groups $G_{j-1}$ is an unequal interval, the target depositing position $30_j$ is positioned centrally between the adjacent target depositing positions g having the largest interval among the adjacent target depositing positions g.

For example, when the target depositing position $30_j$ is positioned between the adjacent target depositing positions g having a narrower interval among the adjacent target depositing positions g in the (j−1)-th target depositing position group $G_{j-1}$, the overlap of a coating liquid deposited on the target depositing position $30_j$ and a coating liquid having been deposited on the target depositing position g adjacent to the target depositing position $30_j$ increases, so that the coating amount distribution on the target line L occurs, and the coating film forming step is terminated in a state where the liquid is not leveled depending on the liquid properties. As a result, the above-described streak is likely to occur in the produced thin film.

On the other hand, if the target depositing positions $30_m$ corresponding to the m-th line head $20_m$ are arranged as described using FIGS. 7 and 8 (in other words, if the nozzle holes 28 of the m-th line head $20_m$ are arranged as described in FIGS. 4 and 5) in the mode in which M is 3 or larger, the target depositing position $30_j$ is not arranged at the adjacent target depositing positions g having a narrower interval among the adjacent target depositing positions g in the (j−1)-th target depositing position group $G_{j-1}$. As a result, the streak caused by the liquid bias does not occur, and it is easy to produce the thin film 10 having a more uniform thickness.

In the mode in which M is any one of 2, 4, and 8, the interval between the adjacent target depositing positions g is an equal interval in the M-th target depositing position group $G_M$. Thus, it is easy to produce the thin film 10 having a more uniform thickness. M is preferably any one of 2, 4, and 8 from this viewpoint, but it is enough that M is any natural number of 2 or larger.

Since the viscosity of the coating liquid is 1 mPa·s or more and 20 mPa·s or less at 25° C., it is easier to form the coating film by using the ink jet apparatus 14. Since the viscosity of the coating liquid is within the above-described range, it is easy to produce the thin film 10 having a more uniform thickness.

Second Embodiment

Figure 10:
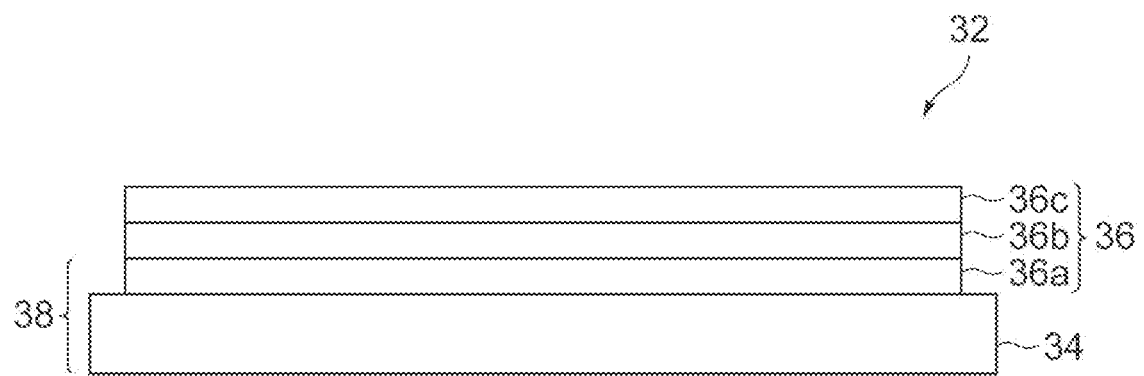
FIG. 10 is a schematic view illustrating a configuration of an organic EL device according to one embodiment of the present invention.

FIG. 10 is a view illustrating a schematic configuration of an example of an organic EL device 32 to be described in a second embodiment. The organic EL device 32 includes a substrate 34, an anode (first electrode) 36a, a light-emitting layer 36b, and a cathode (second electrode) 36c. The anode 36a, the light-emitting layer 36b, and the cathode 36c form an organic EL element 36. The organic EL device 32 may be a bottom emission type in which light is emitted from the substrate 34 side or a top emission type in which light is emitted from a side opposite to the substrate 34. Hereinafter, the bottom emission type will be mainly described. Hereinafter, the substrate 34 on which the anode 36a is provided is also referred to as an electrode-attached substrate 38 in some cases.

The substrate 34 is a plate-shaped transparent member that has a light-transmitting property with respect to visible light (light having a wavelength of 400 nm to 800 nm). An example of a thickness of the substrate 34 is 30 μm or larger and 500 μm or smaller. For example, the substrate 34 may be a rigid substrate such as a glass substrate and a silicon substrate or a flexible substrate such as a plastic substrate and a polymer film. The organic EL device 32 can have flexibility when the flexible substrate is used. A circuit for driving the organic EL element 36 may be formed in advance on the substrate 34. For example, a thin film transistor (TFT), a capacitor, and the like may be formed in advance on the substrate 34.

The anode 36a is provided on the substrate 34. As the anode 36a, an electrode made of metal oxide, metal sulfide, metal, or the like can be used. Specifically, an electrode in which a thin film made of indium oxide, zinc oxide, tin oxide, indium tin oxide (abbreviated as ITO), indium zinc oxide (abbreviated as IZO), and the like and a grid as an auxiliary wiring made of gold, platinum, silver, copper, and the like are combined is used. In the case where the organic EL device 32 is a device that emits light from the substrate 34 side, a light-transmitting electrode is used as the anode 36a. An example of a thickness of the anode 36a is 10 nm to 600 nm when including the auxiliary wiring.

The light-emitting layer 36b is provided on the anode 36a. As the light-emitting layer 36b, an organic thin film having a function of emitting light of a predetermined wavelength can be used. The light-emitting layer 36b is generally formed using an organic substance that mainly emits fluorescence and/or phosphorescence, or the organic substance and a dopant assisting the organic substance. The dopant is added in order to, for example, improve light emission efficiency or changing a light emission wavelength. The organic substance included in the light-emitting layer 36b may be either a low molecular weight compound or a high molecular weight compound. Examples of the organic light-emitting material forming the light-emitting layer 36b include known dye based materials, metal complex-based materials, polymer-based materials, and dopant materials. The light-emitting layer 36b is configured using the thin film containing the above-described organic light-emitting material. An example of a thickness of the light-emitting layer 36b is 10 nm to 200 nm.

The cathode 36c is provided on the light-emitting layer 36b. A material of the cathode 36c is preferably a material which has a small work function, enables easy injection of electrons into the light-emitting layer 36b, and has high electric conductivity. When the organic EL device 32 emits light from the anode 36a side, a material having a high visible light reflectance is preferable as the material of the cathode 36c in order to reflect the light radiated from the light-emitting layer 36b to the anode 36a side by the cathode 36c. For example, alkali metal, alkaline earth metal, transition metal, a group 13 metal of the periodic table, and the like can be used as the cathode 36c. A transparent conductive electrode made of a conductive metal oxide and a conductive organic substance or the like can be used as the cathode 36c. An example of a thickness of the cathode 36c is 100 nm to 800 nm.

Next, an example of a method of producing the organic EL device 32 will be described. In the case of producing the organic EL device 32, the anode 36a is produced on the substrate 34 (an anode producing step). Thereafter, the light-emitting layer 36b is produced on the anode 36a (a light-emitting layer producing step). Subsequently, the cathode 36c is produced on the light-emitting layer 36b (a cathode producing step).

In the anode producing step (first electrode producing step), the anode 36a can be formed by a vapor deposition method or a coating method. In the case of producing the anode 36a by the coating method, for example, the thin film production method described in the first embodiment can be applied. In this case, the anode 36a can be produced by using the substrate 34 as the support 12 in the first embodiment, applying a coating liquid containing a material to serve as the anode 36a onto the substrate 34 to form a coating film, and drying the coating film. However, the anode 36a may be produced using other coating methods. Examples of the other coating methods include a spin coating method, a casting method, a micro-gravure coating method, a gravure coating method, a bar coating method, a roll coating method, a wire bar coating method, a dip coating method, a slit coating method, a capillary coating method, a spray coating method, a nozzle coating method, a gravure printing method, a screen printing method, a flexographic printing method, an offset printing method, a reverse printing method, and the like.

In the light-emitting layer producing step (thin film producing step), the light-emitting layer 36b as the thin film containing the organic light-emitting material is produced using the thin film production method according to the first embodiment. In this case, the thin film production method described in the first embodiment may be applied using the electrode-attached substrate 38 as the support 12 in the first embodiment and the organic light-emitting material as the thin film forming material.

In the cathode producing step (second electrode producing step), the cathode 36c can be formed by a vapor deposition method or a coating method. In the case of producing the cathode 36c by the coating method, for example, the thin film production method described in the first embodiment can be applied. In this case, the cathode 36c can be produced by using the substrate 34 as the support 12 in the first embodiment, applying a coating liquid containing a material to serve as the cathode 36c onto the substrate 34 to form a coating film, and drying the coating film. However, the cathode 36c may be produced using other coating methods exemplified in the anode producing step.

In the above-described method of producing the organic EL device 32, the thin film production method described in the first embodiment is applied at least when producing the light-emitting layer 36b. Thus, it is possible to efficiently produce the light-emitting layer 36b. As a result, the quality and production efficiency of the organic EL device 32 are improved. In addition, the method of producing the organic EL device 32 has the same operational effects as the operational effects of the thin film production method described in the thin film production method of the first embodiment.

Although the organic EL device 32 illustrated in FIG. 10 has been described as above, another organic layer may be further provided between the anode 36a and the cathode 36c of the organic EL element 36 in addition to the light-emitting layer 36b. This will be described in detail hereinafter.

Examples of the layer to be provided between the cathode 36c and the light-emitting layer 36b include an electron injection layer, an electron transport layer, and a hole-blocking layer. When both the electron injection layer and the electron transport layer are provided between the cathode 36c and the light-emitting layer 36b, a layer in contact with the cathode 36c is referred to as the electron injection layer, and a layer obtained by excluding this electron injection layer is referred to as the electron transport layer.

The electron injection layer is a layer having a function of improving the electron injection efficiency from the cathode 36c. The electron transport layer is a layer having a function of improving electron injection from the cathode 36c, the electron injection layer, or the electron transport layer closer to the cathode 36c. The hole-blocking layer is a layer having a function of blocking transport of holes. When the electron injection layer and/or the electron transport layer has the function of blocking the transport of holes, these layers may also serve as the hole-blocking layer. The fact that the hole-blocking layer has the function of blocking the transport of holes can be confirmed, for example, by producing the organic EL element 36 which allows only a hole current to flow therethrough and through the blocking effect with a decrease in the current value thereof.

Examples of the layer to be provided between the anode 36a and the light-emitting layer 36b include a hole injection layer, a hole transport layer, and an electron-blocking layer. A layer in contact with the anode 36a is referred to as the hole injection layer.

The hole injection layer is a layer having a function of improving efficiency in hole injection from the anode 36a. The hole transport layer is a layer having a function of improving the hole injection from the anode, the hole injection layer, or the hole transport layer closer to the anode 36a. The electron-blocking layer is a layer having a function of blocking the transport of electrons. When the hole injection layer and/or the hole transport layer has the function of blocking the transport of electrons, these layers may also serve as the electron-blocking layer. The fact that the electron-blocking layer has the function of blocking the transport of electrons can be confirmed, for example, by producing an organic EL element which allows only an electron current to flow therethrough and through the effect of blocking the transport of electrons with a decrease in the measured current value thereof.

Examples of a layer configuration of the organic EL element including the various organic layers described above will be described hereinafter.

(a) Anode/light-emitting layer/cathode
(b) Anode/hole injection layer/light-emitting layer/cathode
(c) Anode/hole injection layer/light-emitting layer/electron injection layer/cathode
(d) Anode/hole injection layer/light-emitting layer/electron transport layer/electron injection layer/cathode
(e) Anode/hole injection layer/hole transport layer/light-emitting layer/cathode
(f) Anode/hole injection layer/hole transport layer/light-emitting layer/electron injection layer/cathode
(g) Anode/hole injection layer/hole transport layer/light-emitting layer/electron transport layer/electron injection layer/cathode
(h) Anode/light-emitting layer/electron injection layer/cathode
(i) Anode/light-emitting layer/electron transport layer/electron injection layer/cathode A symbol "/" means that layers on both sides of the symbol "/" are bonded to each other. The configuration of the above-described (a) corresponds to the configuration illustrated in FIG. 1.

Known materials can be used as each material of the hole injection layer, the hole transport layer, the electron transport layer, and the electron injection layer. For example, similarly to the light-emitting layer 36b, a thin film produced using the thin film production method described in the first embodiment can be used for each of the hole injection layer, the hole transport layer, the electron transport layer, and the electron injection layer. In the case of producing each of the hole injection layer, the hole transport layer, the electron transport layer, and the electron injection layer using the thin film production method described in the first embodiment, the substrate 34 on which the layer structure between each layer and the substrate 34 is formed may be used as the support 12 in the first embodiment and the material that is to form each layer may be used as the thin film forming material.

The organic EL element may include either the single light-emitting layer 36b or two or more light-emitting layers 36b. When a stacked structure arranged between the anode 36a and the cathode 36c is defined as a "structural unit I" in any one of the layer configurations of (a) to (i) described above, it is possible to exemplify a layer configuration illustrated in the following (j), for example, as a configuration of an organic EL element having the two light-emitting layers 36b. The layer configuration of two units (structural units I) may be the same as or different from each other.

(j) Anode/(structural unit I)/charge generation layer/(structural unit I)/cathode Here, a charge generation layer is a layer that generates holes and electrons by applying an electric field. Examples of the charge generation layer include a thin film made of vanadium oxide, ITO, molybdenum oxide, or the like.

When "(structural unit I)/charge generation layer" is defined as a "structural unit II", a layer configuration illustrated in the following (k) is exemplified as a configuration of an organic EL element having three or more light-emitting layers, for example.

(k) Anode/(structural unit II)x/(structural unit I)/cathode

In the second embodiment, the symbol "x" represents an integer of 2 or larger, and "(structural unit II)x" represents a stacked body in which (structural unit II) is stacked in x stages. The layer configuration of a plurality of units (structural units II) may be the same as or different from each other.

An organic EL element may be constituted by directly stacking the plurality of light-emitting layers 36b without providing the charge generation layer.

The order of the layers to be formed on the substrate 34, the number of layers, and a thickness of each layer can be appropriately set in consideration of light emission efficiency and product life. The organic EL element is generally provided on the substrate 34 with the anode 36a arranged on the substrate 34 side, but the organic EL element may be provided on the substrate 34 with the cathode 36c arranged on the substrate 34 side. For example, when each of the organic EL elements of (a) to (k) is produced on the substrate 34, each layer is stacked on the substrate 34 sequentially from the anode side (the left side of each of the configurations (a) to (k)) in the mode of arranging the anode 36a on the substrate 34 side, and each layer is stacked on the substrate 34 sequentially from the cathode (the right side of each of the structures (a) to (k)) in the mode of arranging the cathode 36c on the substrate 34 side.

Although various embodiments according to the present invention have been described above, the present invention is not limited to the illustrated various embodiments, and various modifications can be made in a scope without departing from a gist of the present invention.

For example, the coating liquid is discharged from the plurality of nozzle holes 28 of the second to M-th line heads $20_2$ to $20_M$ toward the target line L, on which the coating liquid discharged from the plurality of nozzle holes 28 of the first line head $20_1$ at the discharge time T is to be deposited, at the respective delay times from the discharge time T in the first embodiment. That is, the target line L on which the coating liquid discharged from the plurality of nozzle holes 28 of the first line head $20_1$ at the discharge time T is to be deposited and a target line on which the target depositing positions $30_2$ to $30_M$ is to be arranged are the same.

Figure 11:
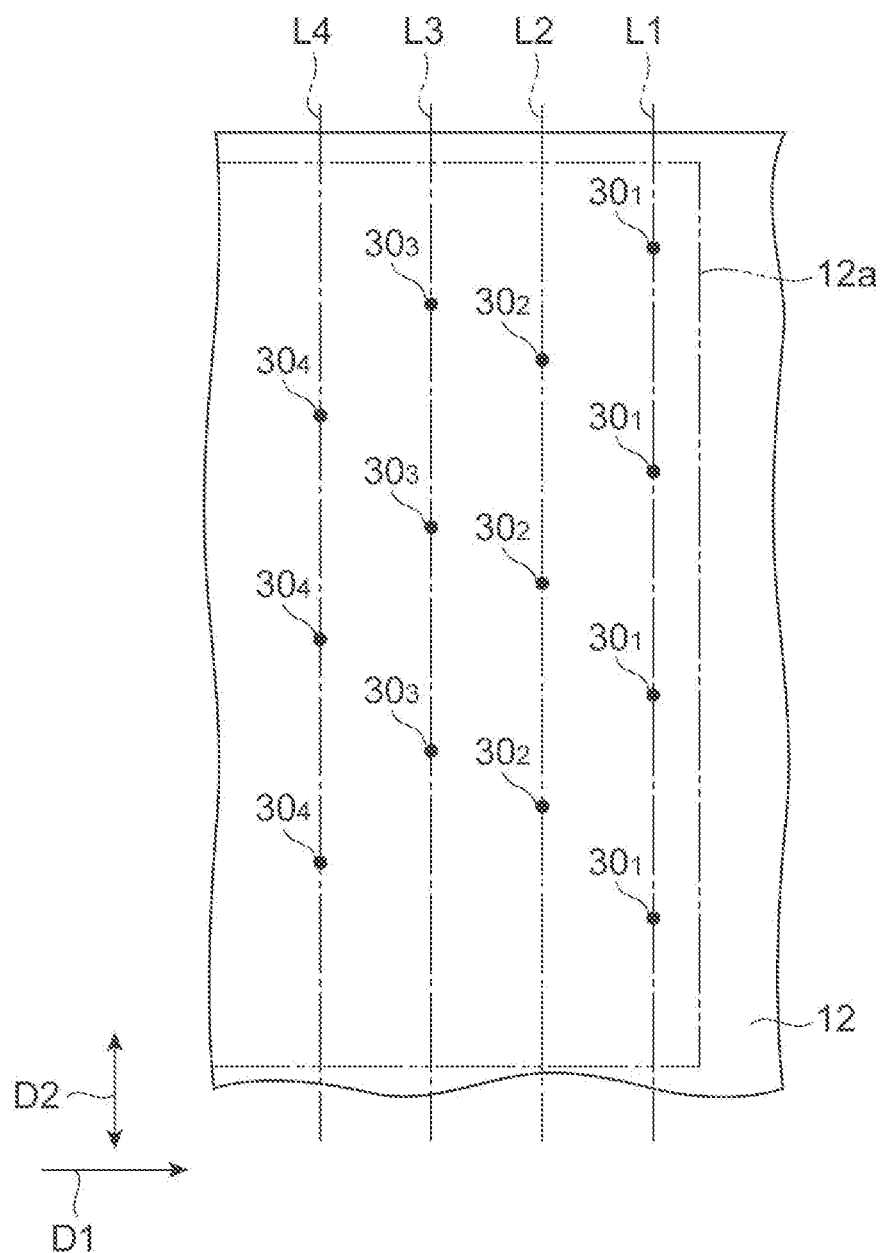
FIG. 11 is a schematic view for describing another example of an arrangement state of target depositing positions corresponding to the first to fourth line heads.

However, target lines L1 to LM corresponding to the plurality of nozzle holes 28 of the first line head $20_1$ to the line head $20_M$, respectively, may be misaligned in the conveying direction D1 as schematically illustrated in FIG. 11. FIG. 11 illustrate the target lines L1, L2, L3, and L4 in the case of M=4. This can be realized by controlling the discharge times from the second to M-th line heads $20_2$ to $20_M$.

Figure 12:
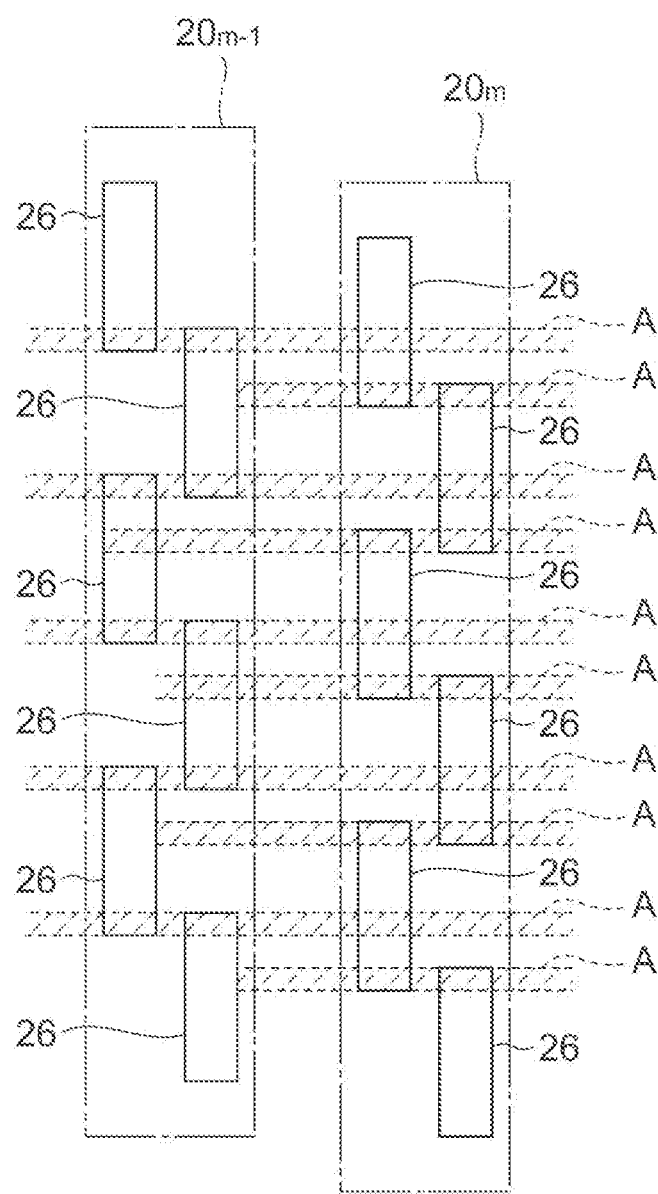
FIG. 12 is a schematic view for describing another example of an arrangement state among the first to M-th line heads.

As illustrated in FIG. 12, the (m−1)-th line head $20_{m-1}$ and the m-th line head $20_m$, which are adjacent in the conveying direction D1 among the first to M-th line heads $20_1$ to $20_M$, may be arranged such that an overlapping region A of the adjacent nozzle heads 26 among the plurality of nozzle heads 26 of the (m−1)-th line head $20_{m-1}$ does not overlap with an overlapping region A of the adjacent nozzle heads 26 among the plurality of nozzle heads 26 of the m-th line head $20_m$ as viewed from the conveying direction D1.

The nozzle holes 28 are formed in each of the nozzle heads 26, and the plurality of nozzle holes 28 included in each of the nozzle heads 26 discharge the coating liquid at the same time. As a result, the coating liquids having been deposited on the support 12 substantially at the same time spread as described above after being deposited and become continues with each other, thereby forming the continuous coating region.

In one line head, the difference in discharge time occurs as the coating liquid is applied from the nozzle hole 28 of the downstream nozzle head 26 after the coating liquid has been discharged from the nozzle holes 28 of the upstream nozzle head 26 of the adjacent nozzle heads 26. Thus, a difference in spread of the liquid derived from the time difference is reduced in the overlapping region A while performing the discharge from the nozzle heads 26 either on the upstream side or the downstream side in the overlapping nozzle holes H in the overlapping region A, but such a difference is recognized as unevenness of a connecting portion depending on the liquid properties in some cases. Even in this case, the above-described difference in the coating liquid amount is dispersed if the overlapping region A in the (m−1)-th line head $20_{m-1}$ and the overlapping region A of the m-th line head $20_m$ are misaligned as viewed from the conveying direction D1 in the (m−1)-th line head $20_{m-1}$ and the m-th line head $20_m$ as illustrated in FIG. 12, and thus, the liquid is more leveled and it is easy to make the thickness of the coating film more uniform. As a result, it is possible to produce the thin film 10 in which the unevenness of the connecting portion is unlikely to be visually recognized.

Figure 13:
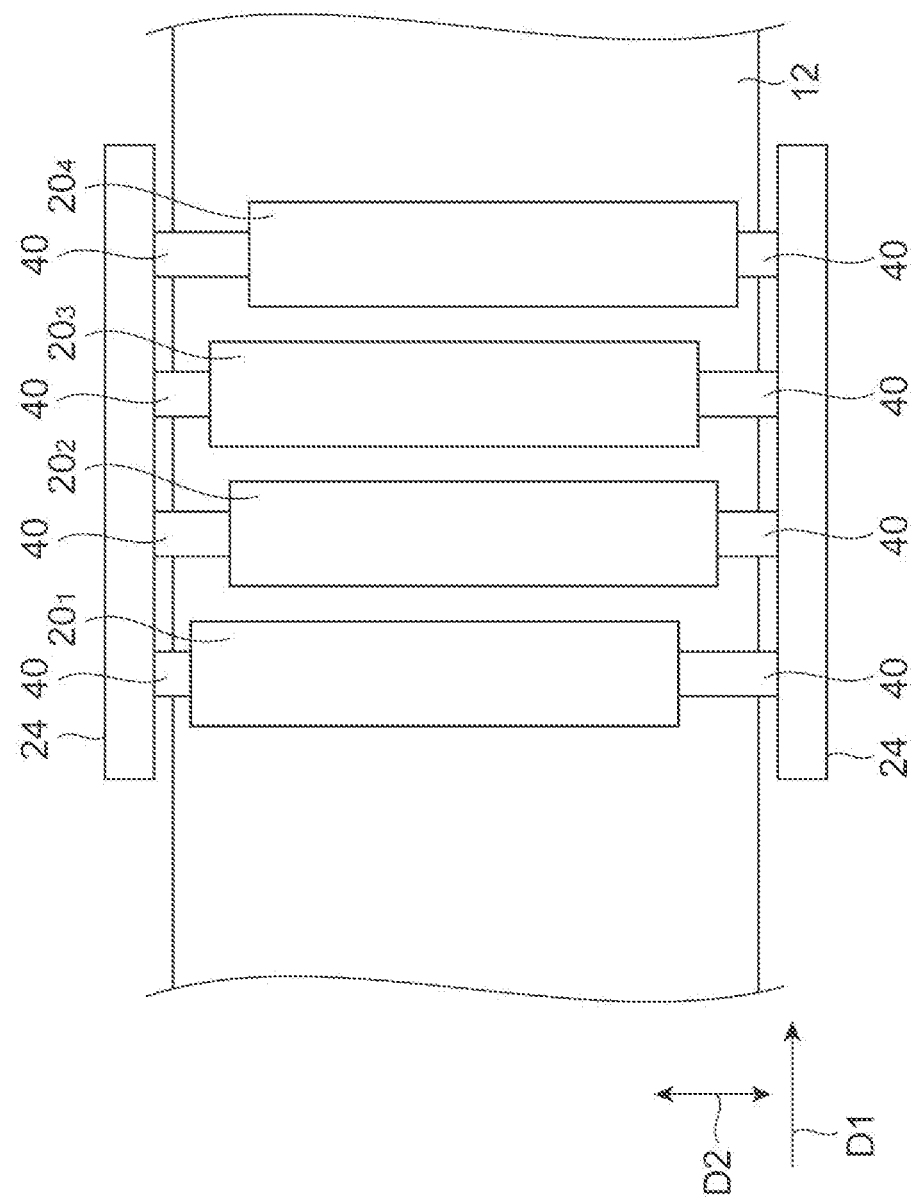
FIG. 13 is a view for describing an example of an apparatus configuration of an ink jet apparatus in order to realize the state illustrated in FIG. 12.

For example, the ink jet apparatus 14 may include the position adjustment mechanism that adjusts positions of the first to M-th line heads $20_1$ to $20_M$ in the width direction D2 in order to realize the above-described arrangement configuration of the (m−1)-th line head $20_{m-1}$ and the m-th line head $20_m$. Examples of such a position adjustment mechanism include a connecting member 40 that connects the supporting frame 24 and the first to M-th line heads $20_1$ to $20_M$ and can adjust the distance between the supporting frame 24 and the first to M-th line heads $20_1$ to $20_M$ in the width direction D2 as illustrated in FIG. 13. Examples of the connecting member 40 include a screw. Alternatively, the connecting member 40 may be a member capable of extending and contracting in length.

It is enough that each of the plurality of nozzle holes 28 of the m-th line head $20_m$ corresponding to the arrangement relationship of the plurality of target depositing positions $30_m$ is also positioned between the adjacent nozzle holes 28 in the (m−1)-th nozzle hole array $Q_{m-1}$. Accordingly, a pitch of the plurality of nozzle holes 28 in the width direction D2 may vary for each of the first to M-th line heads $20_1$ to $20_M$. Alternatively, a pitch in the width direction D2 of the plurality of nozzle holes 28 in one line head may also vary. It is enough that the target depositing position $30_m$ is also arranged between adjacent target depositing positions g.

M is set to any one of 2, 4, and 8 in the first embodiment, but it is enough that any natural number of 2 or larger is used. However, M is preferably any one of 2, 4, and 8 as described above.

The mode of N=M has been described in the first embodiment. However, M may be smaller than N. For example, when the number of target depositing positions in the width direction D2 may be set to small (in other words, the resolution in the width direction D2 may be set to low) in accordance with a thickness of a thin film to be produced, M, which is smaller than N, line heads may be used among the N line heads. As a result, for example, when the same coating liquid supply source is used for the N line heads, it is possible to reduce the amount of charged liquid and to use the liquid of a small lot by eliminating supply of the liquid to an unnecessary pipe (a supply pipe to (N−M) line heads). In the case of using the M, which is smaller than N, line heads among the N line heads, the arrangement relationship of the target depositing positions described in the first embodiment or the arrangement relationship of the nozzle holes corresponding thereto is preferably realized for the M line heads. Meanwhile, the arrangement relationship of the target depositing positions described in the first embodiment or the arrangement relationship of the nozzle holes corresponding thereto may be realized for the M line heads assuming that all the N line heads are used in the case of using the M, which is smaller than N, line heads among the N line heads.

REFERENCE SIGNS LIST

10 . . . thin film, 12 . . . support, 20 . . . line head, $20_1$ . . . first line head, $20_m$ . . . m-th line head (m is a natural number of 2 or larger and M or smaller), 22 . . . line head group, 26 . . . nozzle head, 28 . . . nozzle hole (thin film forming nozzle hole), $30_m$ . . . target depositing position, 32 . . . organic EL device, 34 . . . substrate, 36a . . . anode (first electrode), 36b . . . light-emitting layer (thin film containing organic light-emitting material), 36c . . . cathode (second electrode), 38 . . . electrode-attached substrate, 40 . . . connecting member (position adjusting mechanism), A . . . overlapping region, D1 . . . conveying direction, D2 . . . width direction (support width direction), $G_{m-1}$ . . . (m−1)-th target depositing position group (m is a natural number of 2 or larger and M or smaller), H . . . nozzle hole, $Q_{m-1}$ . . . (m−1)-th nozzle hole array, L, L1, L2, L3, L4 . . . target line, P . . . virtual plane, g . . . target depositing position.

The invention claimed is:

1. A thin film production method for forming a thin film on a support by using an ink jet method while conveying the support, the method comprising:
  a coating film forming step of discharging a coating liquid containing a thin film forming material to a thin film formation region on the support from first to M-th line heads (M is a natural number of 2 or larger and N or smaller) among N line heads while causing the support to pass through a line head group once, the line head group including the N line heads (N is a natural number of 2 or larger) arranged to be spaced apart from each other in a conveying direction of the support, and forming a coating film in which the coating liquid deposited on the support is continuous; and
  a drying step of obtaining the thin film by drying the coating film,
  wherein
  each of the N line heads has a plurality of thin film forming nozzle holes arrayed in a support width direction, which is a direction orthogonal to the conveying direction,
  the first to M-th line heads are arranged sequentially upstream to downstream in the conveying direction,
  when a thin film forming nozzle hole array, obtained by projecting the plurality of thin film forming nozzle holes of first to m-th line heads (m is a natural number of 2 or larger and M or smaller) among the first to M-th line heads onto a virtual plane orthogonal to the conveying direction is set as an m-th thin film forming nozzle hole array, the plurality of thin film forming nozzle holes included in the m-th line head are arranged in the m-th line head so as to be positioned between adjacent thin film forming nozzle holes in an (m−1)-th thin film forming nozzle hole array,
  in the coating film forming step, the first line head discharges the coating liquid onto the support at a plurality of discharge times, and the m-th line head discharges the coating liquid onto the support at a predetermined delay time with respect to the discharge time of the first line head for each discharge of the coating liquid by the first line head at each of the times, and the first to M-th line heads discharge the coating liquid onto the support from thin film forming nozzle holes selected, in accordance with a shape of the thin film formation region, from among the plurality of thin film forming nozzle holes included in each of the first to M-th line heads for each of the discharge times of the first to M-th line heads, and wherein each of the first to M-th line heads includes a plurality of nozzle heads, each of the nozzle heads has a plurality of nozzle holes arranges at a predetermined interval in the support width direction, at least some of all the plurality of nozzle holes included in the plurality of nozzle heads are the plurality of thin film forming nozzle holes, in each of the first to M-th line heads, adjacent nozzle heads among the plurality of nozzle heads are arranges so as to partially overlap with each other as viewed from the conveying direction, and the plurality of nozzle heads, included in each of adjacent line heads among the first to M-th line heads are arranged such that an overlapping region of the adjacent nozzle heads in an upstream line head of the adjacent line heads in the conveying direction and an overlapping region of the adjacent line heads in a downstream line head of the adjacent line heads in the conveying direction do not overlap with each other as viewed from the conveying direction.

2. The thin film production method according to claim 1, wherein
the plurality of thin film forming nozzle holes are arranged at a pitch p in the support width direction.

3. The thin film production method according to claim 2, wherein
each of the plurality of thin film forming nozzle holes included in the second line head is arranged centrally between adjacent thin film forming nozzle holes among the plurality of thin film forming nozzle holes included in the first line head as viewed from the conveying direction.

4. The thin film production method according to claim 3, wherein
a difference between a depositing position of the coating liquid discharged from the thin film forming nozzle hole of the second line head and a target depositing position with respect to the thin film forming nozzle hole is ¼ of the pitch p or smaller.

5. The thin film production method according to claim 3, wherein
the M is any one of 2, 4, and 8.

6. The thin film production method according to claim 3, wherein
the M is 3 or larger, and
the plurality of thin film forming nozzle holes of a j-th line head (j is a natural number of 3 or larger and M or smaller) among the third to M-th line heads are arranged in the j-th line head so as to be positioned between adjacent thin film forming nozzle holes in a (j−1)-th thin film forming nozzle hole array when an interval between adjacent thin film forming nozzle holes in the (j−1)-th thin film forming nozzle hole array is an equal interval in the support width direction, and are arranged in the j-th line head so as to be positioned between adjacent thin film forming nozzle holes having a largest interval in the (j−1)-th thin film forming nozzle hole array when the interval between the adjacent thin film forming nozzle holes in the (j−1)-th thin film forming nozzle hole array is an unequal interval in the support width direction.

7. The thin film production method according to claim 1, wherein
when the m-th line head discharges the coating liquid at the predetermined delay time with respect to the discharge time of the first line head, the first and m-th line heads discharge the coating liquid on the same vertical line with respect to the conveying direction.

8. The thin film production method according to claim 1, wherein
when the m-th line head discharges the coating liquid at the predetermined delay time with respect to the discharge time of the first line head, the coating liquid is discharged on different vertical lines with respect to the conveying direction.

9. The thin film production method according to claim 1, wherein
a viscosity of the coating liquid is 1 mPa·s or more and 20 mPa·s or less at 25° C.

10. The thin film production method according to claim 1, wherein
the first to M-th line heads are arranged using a position adjustment mechanism with respect to the support width direction such that the overlapping region of the adjacent nozzle heads in the upstream line head of the adjacent line heads in the conveying direction and the overlapping region of the adjacent nozzle heads in the downstream line head of the adjacent line heads in the conveying direction on do not overlap with each other as viewed from the conveying direction.

11. The thin film production method according to claim 1, wherein
the support has flexibility.

12. A method of producing an organic EL device that includes a first electrode, a second electrode, and a thin film containing an organic light-emitting material, which is provided between the first electrode and the second electrode, on a substrate, the method comprising:
a first electrode producing step of producing the first electrode on the substrate to obtain an electrode-attached substrate;
a thin film producing step of producing the thin film on the support using the organic light-emitting material as the thin film forming material and the electrode-attached substrate as the support in the thin film production method according to claim 1; and
a second electrode producing step of producing the second electrode on the thin film.

* * * * *